United States Patent [19]
Yoshida et al.

[11] Patent Number: 5,981,369
[45] Date of Patent: Nov. 9, 1999

[54] SEMICONDUCTOR INTEGRATED CIRCUIT DEVICE AND PROCESS FOR MANUFACTURING THE SAME

[75] Inventors: Makoto Yoshida; Takahiro Kumauchi, both of Tokyo; Yoshitaka Tadaki, Hannou; Kazuhiko Kajigaya, Iruma; Hideo Aoki, Tokyo; Isamu Asano, Iruma, all of Japan

[73] Assignee: Hitachi, Ltd., Tokyo, Japan

[21] Appl. No.: 08/865,864

[22] Filed: May 30, 1997

[30] Foreign Application Priority Data

May 31, 1996 [JP] Japan .................................. 8-137957

[51] Int. Cl.[6] ................................................. H01L 21/44
[52] U.S. Cl. ......................... 438/597; 438/598; 438/605; 438/610; 438/618; 438/629; 438/630; 438/657; 438/647; 438/241
[58] Field of Search ..................................... 438/504, 586, 438/589, 592, 595, 597, 598, 605, 610, 614, 629, 647, 648, 649, 657, 618, 630, 241

[56] References Cited

U.S. PATENT DOCUMENTS 4,954,214  9/1990  Ho .
5,116,780  5/1992  Samata et al. .
5,378,652  1/1995  Samata et al. .
5,587,338  12/1996  Tseng .
5,717,250  2/1998  Schuele et al. .
5,854,127  3/1997  Pan .

Primary Examiner—John F. Niebling
Assistant Examiner—Jonathan Hack
Attorney, Agent, or Firm—Antonelli, Terry, Stout & Kraus, LLP

[57] ABSTRACT

In a process for manufacturing a semiconductor integrated circuit device having a MISFET, in order that a shallow junction between the source/drain of the MISFET and a semiconductor substrate may be realized by reducing the number of heat treatment steps, all conductive films to be deposited on the semiconductor substrate are deposited at a temperature of 500° C. or lower at a step after the MISFET has been formed. Moreover, all insulating films to be deposited over the semiconductor substrate are deposited at a temperature of 500° C. or lower at a step after the MISFET has been formed.

4 Claims, 49 Drawing Sheets

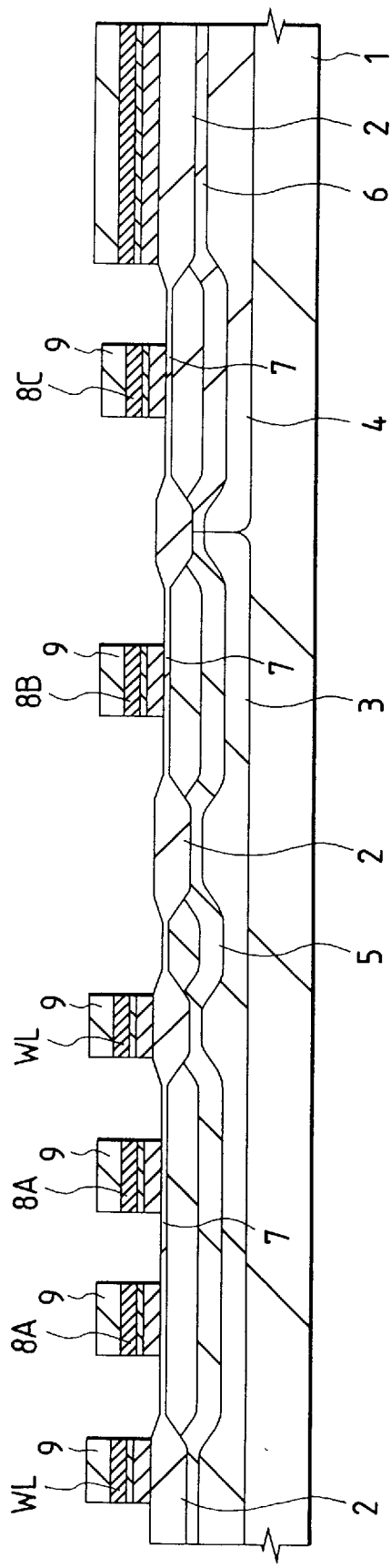
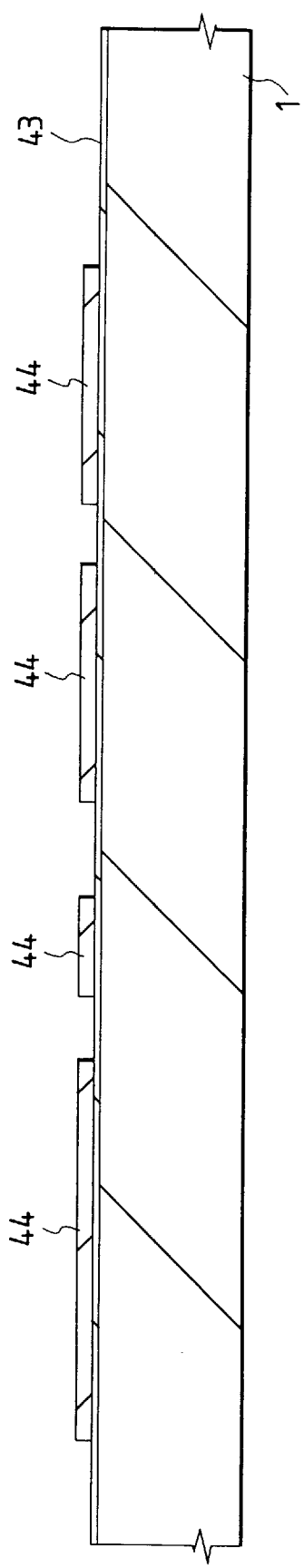
FIG. 17
FIG. 18

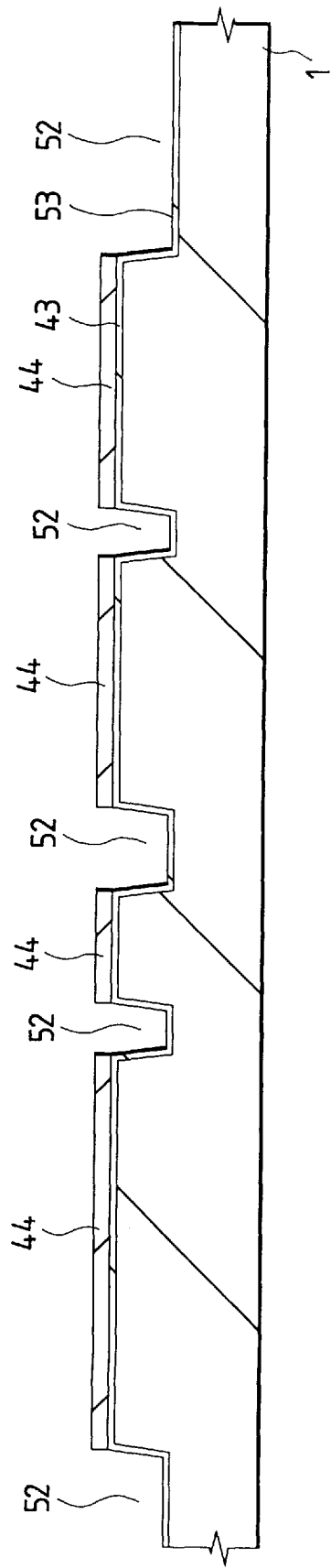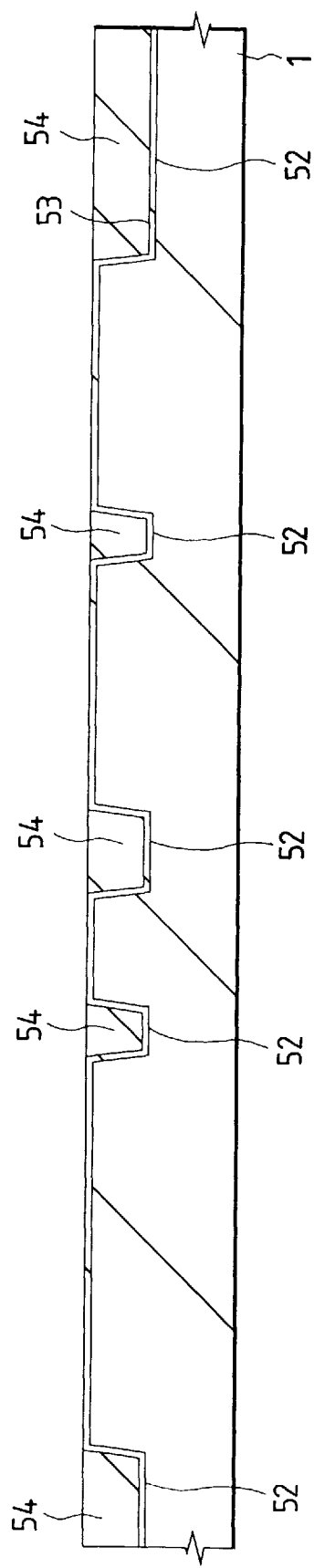

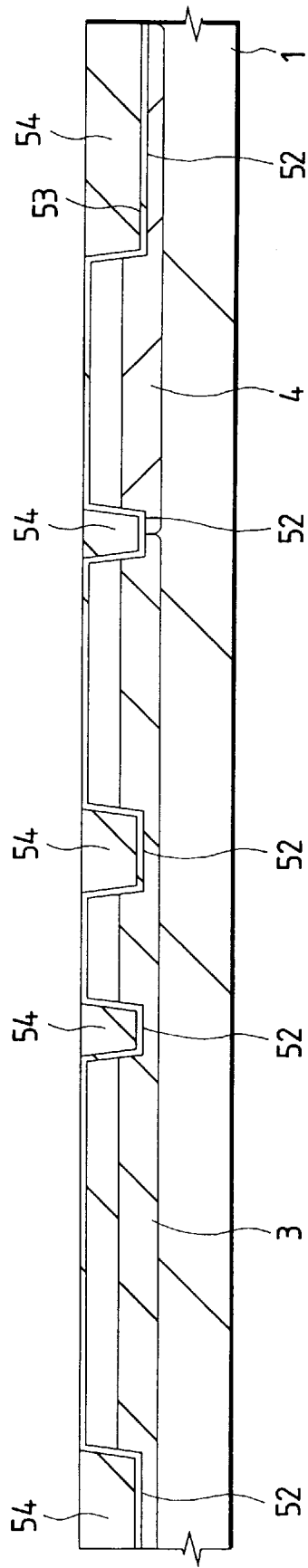
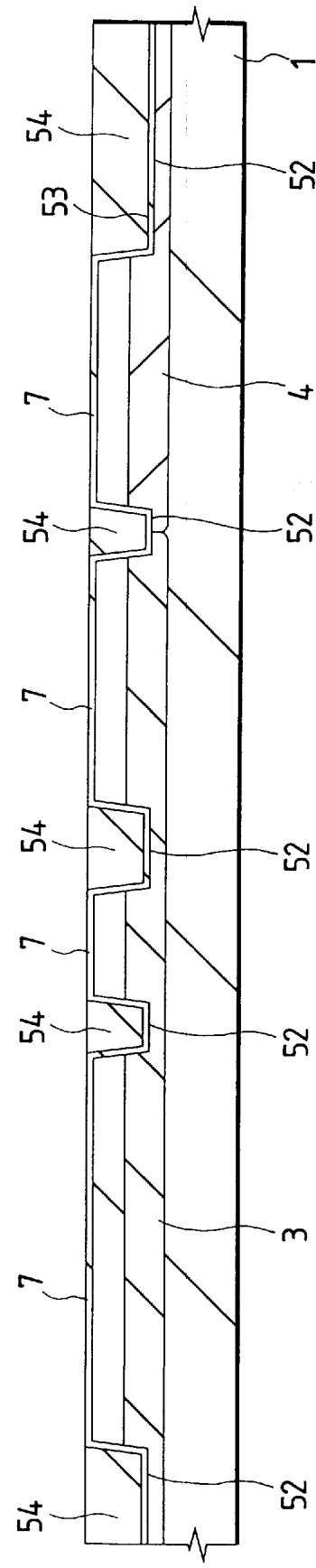

SEMICONDUCTOR INTEGRATED CIRCUIT DEVICE AND PROCESS FOR MANUFACTURING THE SAME

BACKGROUND OF THE INVENTION

1. Field of the Invention

The present invention relates to a technique for manufacturing a semiconductor integrated circuit device having MISFETs (Metal Insulator Semiconductor Field Effect Transistors) and, more particularly, to a technique which is effective if applied to the manufacture of a semiconductor integrated circuit device having a DRAM (Dynamic Random Access Memory).

2. Background of the Invention

The LSI, represented by a large capacity DRAM of recent years, has encountered a serious problem in that the high cost of manufacture has been raised by an increase in the number of manufacturing steps, as the manufacturing process becomes more complicated with increases in integration, speed and function. In accordance with this, the number of insulating films and conductive films deposited over a semiconductor substrate at a temperature of 700 to 900° C. has increased to make it difficult to achieve a high performance for the MISFETs by realizing a shallow junction. Moreover, the increase in the wiring resistance resulting from the miniaturization raises an obstruction to the speedup.

SUMMARY OF THE INVENTION

An object of the present invention is to provide a technique capable of reducing the number of heat treatment steps in a process for manufacturing a semiconductor integrated circuit device having MISFETs.

Another object of the present invention is to provide a technique capable of simplifying the process for manufacturing a semiconductor integrated circuit device having MISFETs.

Another object of the present invention is to provide a technique capable of lowering the wiring resistance of a semiconductor integrated circuit device having MISFETs.

Another object of the present invention is to improve the manufacturing yield of a semiconductor integrated circuit device having DRAMs.

Another object of the present invention is to improve the electrical characteristics of a semiconductor integrated circuit device having DRAMs.

The aforementioned and other objects and novel features of the present invention will become apparent from the following description to be made with reference to the accompanying drawings.

Representatives of the aspects of the invention, as disclosed herein, will be briefly described in the following.

By a process for manufacturing a semiconductor integrated circuit device of the present invention, all conductive films to be deposited over a semiconductor substrate are deposited at a temperature of 500° C. or lower at a step after formation of the MISFETs.

By a process for manufacturing a semiconductor integrated circuit device of the present invention, all conductive films to be deposited over a semiconductor substrate are made of a metal or its compound.

By a process for manufacturing a semiconductor integrated circuit device of the present invention, all insulating films to be deposited over a semiconductor substrate are deposited at a temperature of 500° C. or lower at a step after formation of the MISFETs.

By the present invention, there is provided a semiconductor integrated circuit device comprising:

(a) a semiconductor substrate having a major surface;

(b) a first semiconductor region formed in the major surface of said semiconductor substrate;

(c) a first insulating film formed over the major surface of said semiconductor substrate and having a first opening for exposing a portion of said first semiconductor region to the outside;

(d) a first conductor layer made of a polysilicon film formed in said first opening;

(e) a second insulating film positioned over said first insulating film and having a second opening for exposing a portion of said first conductor layer to the outside; and (f) a second conductor layer formed in said second opening, wherein a silicide layer is formed at the interface between said first conductor layer and said second conductor layer.

According to the present invention, there is provided a process for manufacturing a semiconductor integrated circuit device comprising:

(a) the step of forming a first semiconductor region in the major surface of a semiconductor substrate;

(b) the step of depositing a first insulating film over the major surface of said semiconductor substrate;

(c) the step of forming a first opening in said first insulating film in such a way as to expose a portion of said first semiconductor region to the outside;

(d) the step of forming a first conductor layer made of a poly-silicon film selectively in said first opening;

(e) the step of forming a silicide film of a refractory metal layer selectively only over said first conductor layer by depositing said refractory metal film over said first conductor layer and said first insulating film and by subjecting the same to a heat treatment;

(f) the step of removing said refractory metal film over said first insulating film while leaving the silicide film of said refractory metal layer;

(g) the step of depositing a second insulating film over said first insulating film to form a second opening for exposing a portion of the silicide film of said refractory metal layer to the outside; and (h) the step of forming a second conductor layer in said second opening.

BRIEF DESCRIPTION OF THE DRAWINGS

FIG. 17 is a cross section of an essential portion of a semiconductor substrate and shows the steps of a process for manufacturing a semiconductor integrated circuit device of representing an Embodiment 2 of the present invention;

FIGS. 18 to 22 are section views of an essential portion of a semiconductor substrate and show respective steps of a process for manufacturing a semiconductor integrated circuit device representing an Embodiment 3 of the present invention;

BRIEF DESCRIPTION OF THE DRAWINGS

Figure 1:
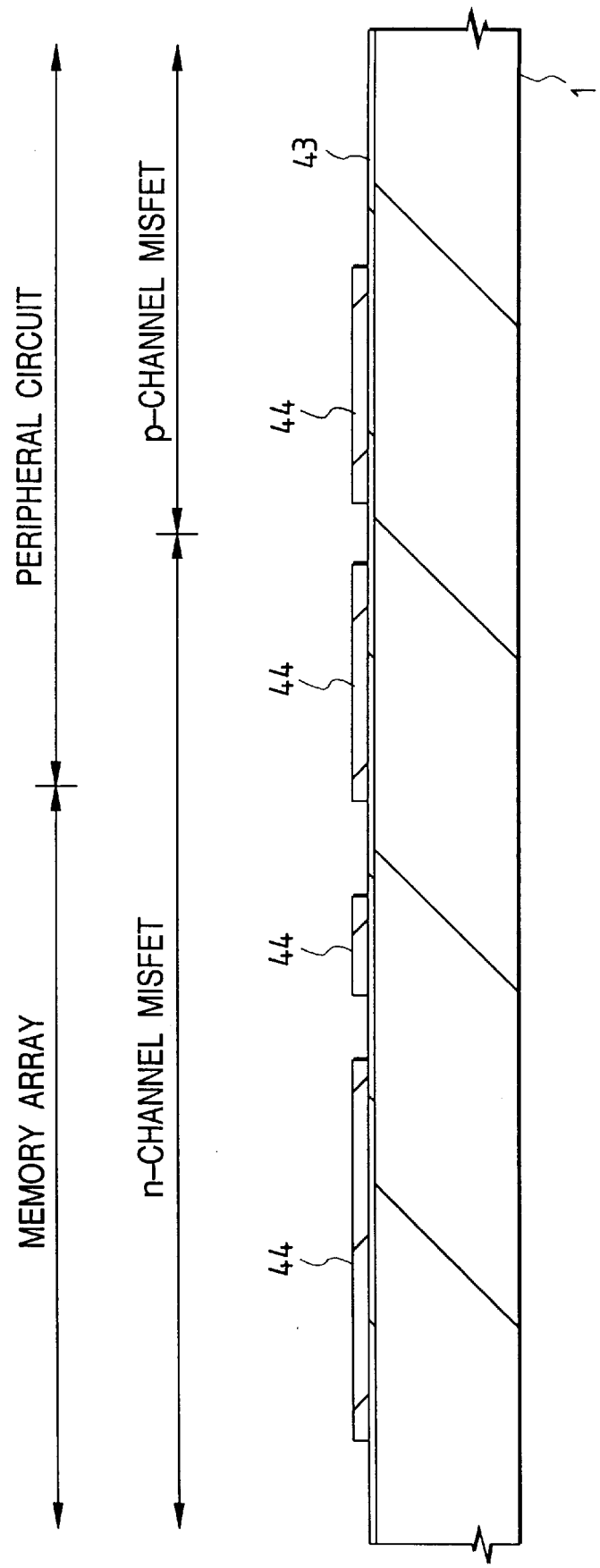
FIGS. 1 to 16 are section views of an essential portion of a semiconductor substrate and show respective steps of a process for manufacturing a semiconductor integrated circuit device representing an Embodiment 1 of the present invention.

The embodiments of the present invention will be described in detail with reference to the accompanying drawings. Throughout the drawings for explaining the various embodiments' the parts or portions having the same functions are designated by the same reference numerals, and their repeated description will be omitted.

(Embodiment 1)

The present embodiment is applied to a process for manufacturing a DRAM having memory cells of stacked capacitor structure, and in which information storing capacitive elements (capacitors) are arranged over memory cell selecting MISFETs.

For manufacturing this DRAM, first of all, there is prepared a semiconductor substrate 1 which is made of a p$^-$-type single crystal silicon having a specific resistance of about 10 Ω·cm, as shown in FIG. 1. The surface of the semiconductor substrate 1 is oxidized to form a thin silicon oxide film 43, and a silicon nitride film 44 is deposited over the silicon oxide film 43 by a CVD method. This silicon nitride film 44 is etched by using a photoresist as a mask to remove the silicon nitride film 44 from an element isolating region.

Figure 2:
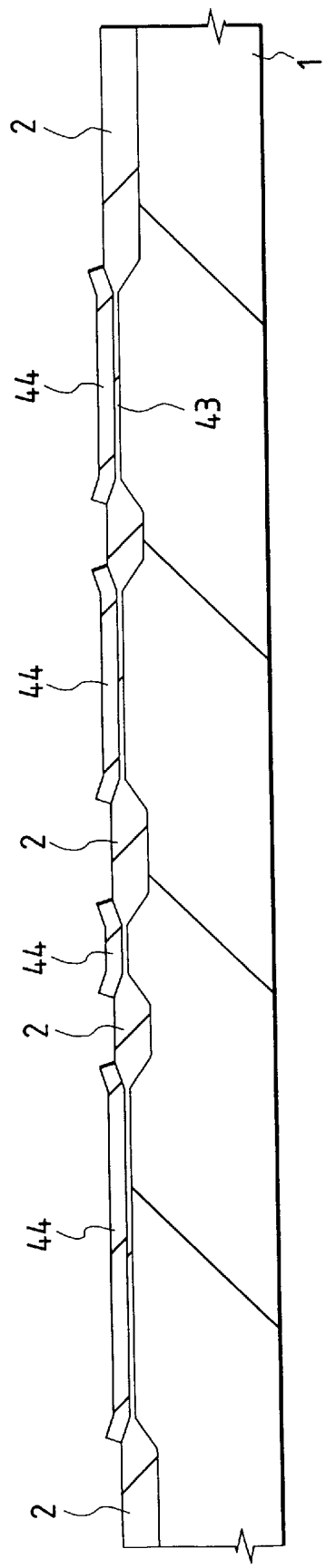

Next, as shown in FIG. 2, the semiconductor substrate 1 is annealed at a temperature of about 1,000° C. by using the silicon nitride film 44 as a mask, to form a field oxide film 2 having a thickness of about 400 nm.

Figure 3:
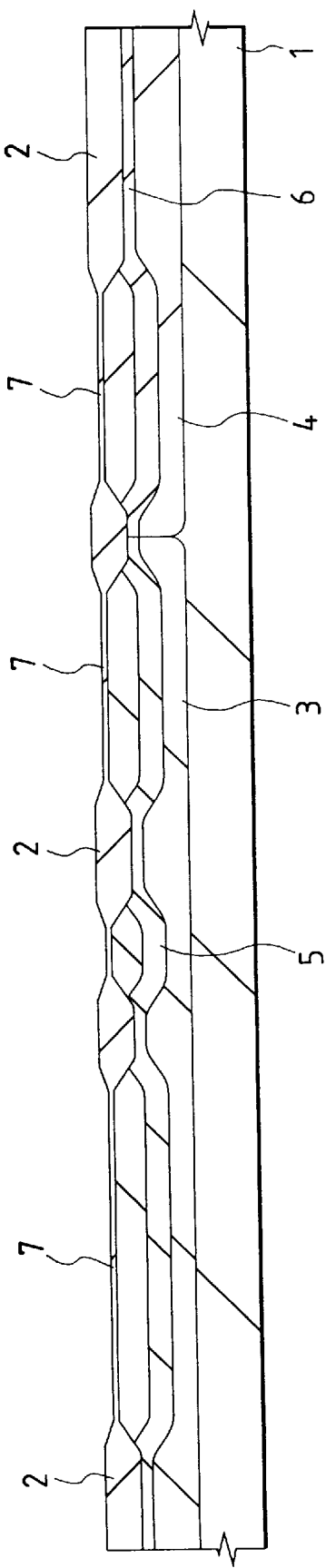

Next, the silicon nitride film 44 is removed, and the semiconductor substrate 1, at the regions to form a memory array and to form n-channel MISFETs of a peripheral circuit, is doped with ions of a p-type impurity (boron (B)), as shown in FIG. 3, to form a p-type well 3. Moreover, the semiconductor substrate 1, at the region to form p-channel MISFETs of a peripheral circuit, is doped with ions of an n-type impurity (phosphor (P)) to form an n-type well 4. Subsequently, the p-type well 3 is doped through the field oxide film 2 with boron (B) ions of a p-type impurity to form a p-channel stopper layer 5 below the field oxide film 2, and the n-type well 4 is doped through the field oxide film 2 with phosphor (P) ions of an n-type impurity to form an n-type channel stopper layer 6 below the field oxide film 2. After this, the surfaces of the individual active regions of the p-type well 3 and the n-type well 4, enclosed by the field oxide film 2, are thermally oxidized at a temperature of about 800° C. to form a gate oxide film 7 having a thickness of about 8 nm.

Figure 4:
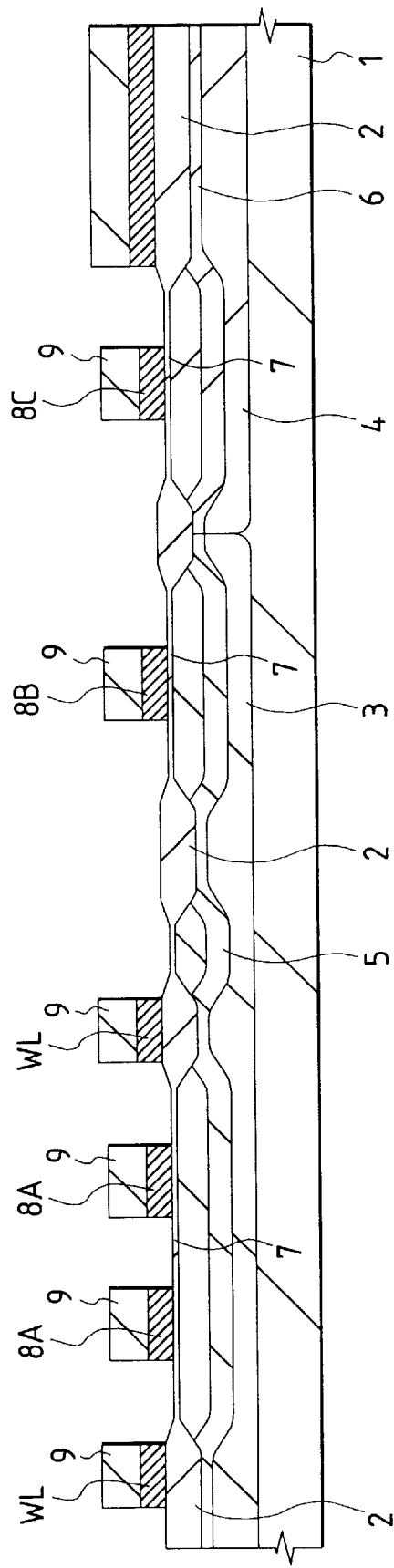

Next, as shown in FIG. 4, there are formed gate electrodes 8A (word lines WL) for the memory cell selecting MISFETs, gate electrodes 8B of the n-channel MISFETs of the peripheral circuit, and gate electrodes 8C of the p-channel MISFETs. These gate electrodes 8A (word lines WL) and the gate electrodes 8B and 8C are simultaneously formed by depositing a tungsten (W) film having a thickness of about 150 nm at a filming temperature of about 475° C. over the semiconductor substrate 1 by a CVD method, by depositing a silicon nitride film 9 having a thickness of about 250 nm at a filming temperature of about 360° C. over the W film by a plasma CVD method, and by patterning those films by an etching method using a photoresist as a mask.

Figure 5:
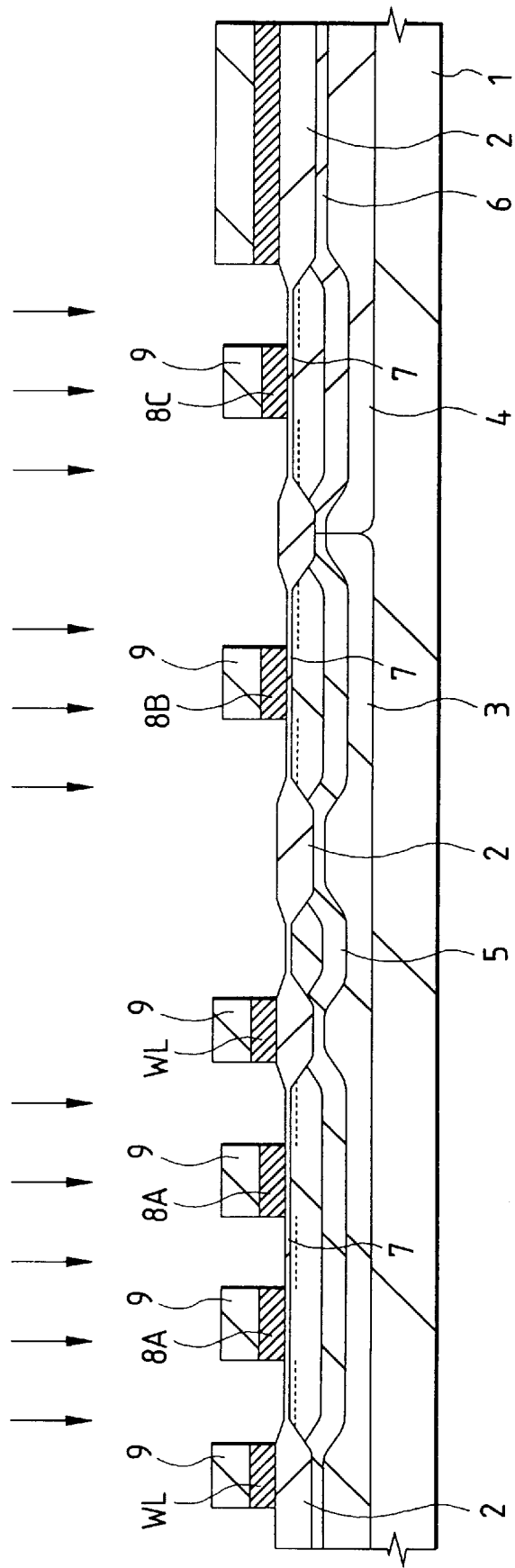

Next, as shown in FIG. 5, the p-type well 3 is doped with ions of an n-type impurity such as phosphor (P) or arsenic (As) by using a (not-shown) photoresist mask for exposing the NMOS forming region to the outside, and the n-type well 4 is doped with boron (8) ions of a p-type impurity by using a (not-shown) photoresist mask for exposing the PMOS forming region to the outside. By the subsequent annealing step, a n-type impurity (P) forms n-type semiconductor regions 11 (a source region and a drain region) of the memory cell selecting MISFETs and n$^-$-type semiconductor region of the n-channel MISFETs of the peripheral circuit in self-alignment with the gate electrodes 8A and 8B, and the p-type impurity (B) forms p$^-$-type semiconductor region 14 of the p-channel MISFETs of the peripheral circuit in self-alignment with the gate electrodes 8C.

Figure 6:
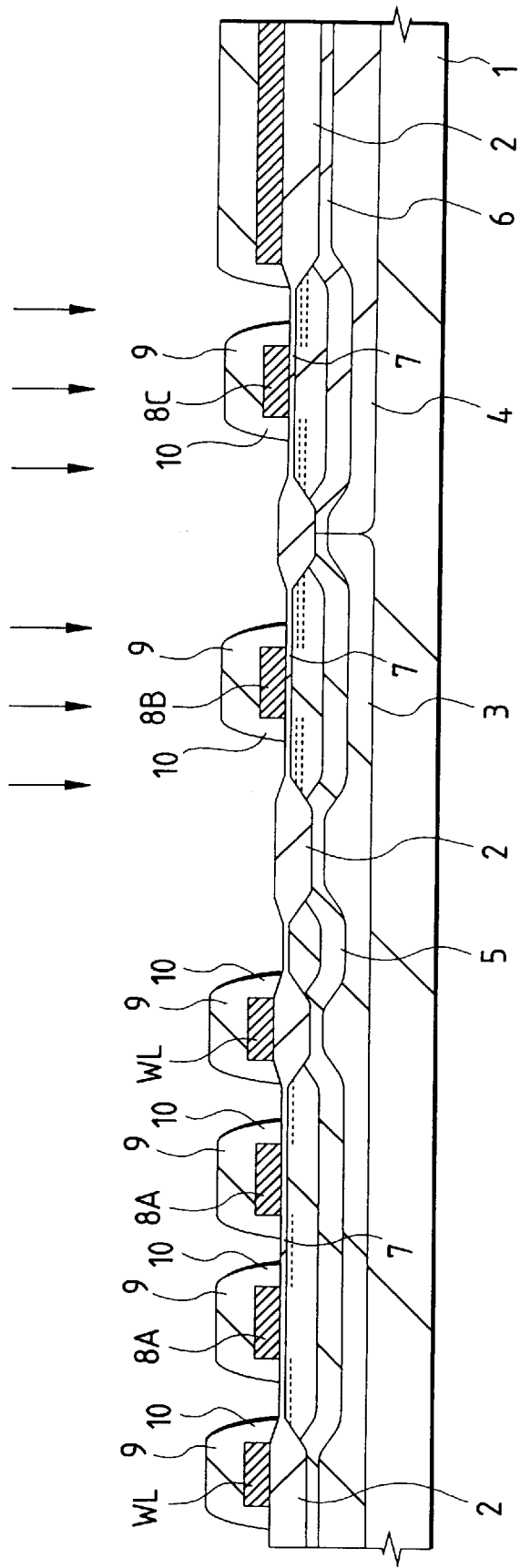

Next, as shown in FIG. 6, side wall spacers 10 are formed at the individual side walls of the gate electrode 8A (word lines WL) and gate electrodes 8B and 8C. After this, the p-type well 3 of the peripheral circuit is doped with ions of an n-type impurity such as arsenic (As) or phosphor (P) by using a (not-shown) photoresist mask covering the memory array region and the PMOS forming region of the peripheral circuit, and the n-type well 4 is doped with boron (B) ions of a p-type impurity by using a (not-shown) photoresist mask covering the memory array region and the NMOS forming region of the peripheral circuit. The side wall spacers 10 are formed by depositing a silicon nitride film having a thickness of about 100 nm at a filming temperature of about 360° C. over the semiconductor substrate 1 using a plasma CVD method and by working the silicon nitride film using an anisotropic etching method.

Figure 7:
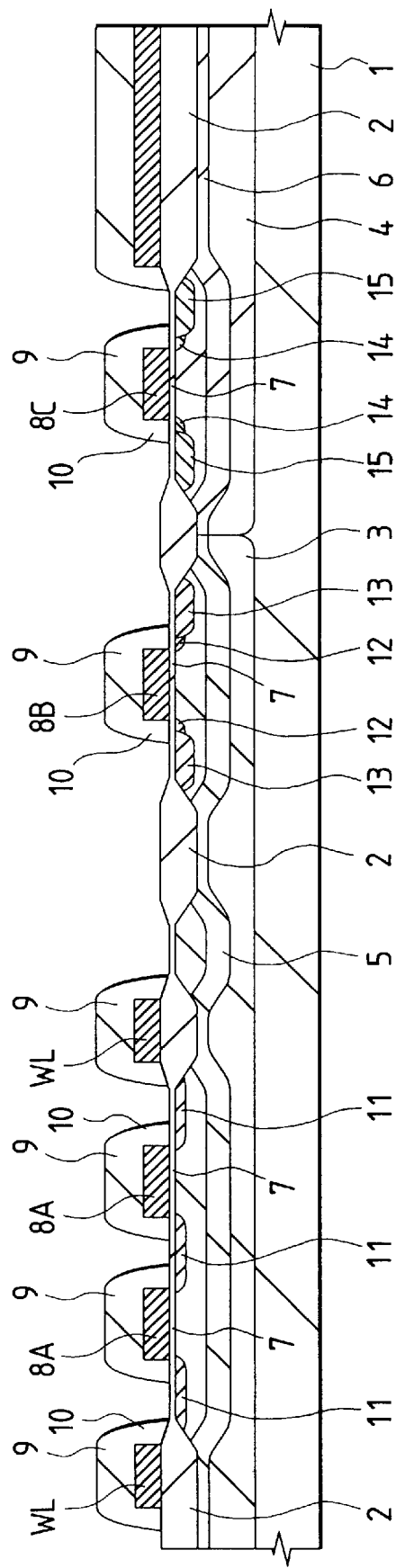

Next, by annealing the semiconductor substrate 1 in a nitrogen atmosphere at about 900° C. to diffuse the aforementioned n-type impurity (P) and p-type impurity, as shown in FIG. 7, there are formed n-type semiconductor regions 11 (the source regions and the drain regions) of the memory cell selecting MISFETs, an n$^-$-type semiconductor region 12 and an n$^+$-type semiconductor region 13 of the n-channel MISFETs of the peripheral circuit, and a p$^-$-type semiconductor region 14 and a p$^+$-type semiconductor region 15 of the p-channel MISFETs. The n$^+$-type semiconductor region 13 and the p$^+$-type semiconductor region 15 are formed in self-alignment with the side wall spacers 10. In the peripheral circuit, the source regions and the drain regions of the n-channel MISFETs are individually constructed of an LDD (Lightly Doped Drain) structure composed of the n$^-$-type semiconductor region 12 and the n$^+$-type semiconductor region 13, and the source regions and the drain regions of the p-channel MISFETs are individually constructed of an LDD structure composed of the p$^-$-type semiconductor region 14 and the p$^+$-type semiconductor region 15.

Figure 8:
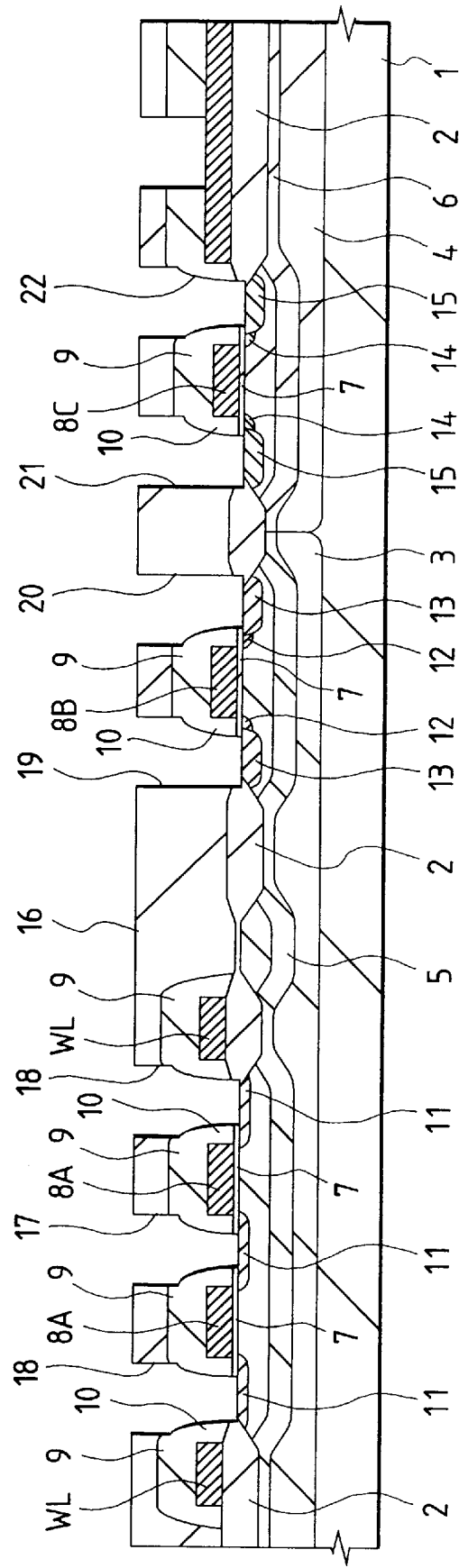

Next, as shown in FIG. 8, contact holes 17 and 18 for exposing a portion of the semiconductor region 11 to the outside are formed over the n-type semiconductor regions 11 (the source regions and the drain regions) of the n-type semiconductor regions 11 of the memory cell selecting MISFETs; contact holes 19 and 20 for exposing portions of the semiconductor regions 12 and 13 to the outside are formed over the n$^+$-type semiconductor regions 13 (the source regions and the drain regions) of the n-channel MISFETs of the peripheral circuit; and contact holes 21 and 22 for exposing portions of the semiconductor regions 14 and 15 to the outside are formed over the p$^+$-type semiconductor regions 15 (the source regions and the drain regions) of the p$^+$-type semiconductor regions 15 of the p-channel MISFETs, by depositing a silicon oxide film 16 having a thickness of about 500 nm at a filming temperature of about 390° C. over the memory cell selecting MISFETs, the n-channel MISFETs and the p-channel MISFETs of the peripheral circuit using a plasma CVD method, by polishing the silicon oxide film 16 by a CMP (Chemical-Mechanical Polishing) method to flatten its surface, and by etching the silicon oxide film 16 and the gate oxide film 7 using a photoresist as a mask.

At this time, the silicon nitride film 9, formed over the gate electrodes 8A (the word lines WL) of the memory cell selecting MISFETs, and the side wall spacers 10 of silicon nitride, formed at the side walls, are slightly etched so that the contact holes 17 and 18 are formed in self-alignment with the side wall spacers. Likewise, the silicon nitride film 9, formed over the gate electrodes 8B of the n-channel MISFETs of the peripheral circuit and over the gate electrodes 8C of the p-channel MISFETs, and the side wall spacers 10 of silicon nitride, formed at the side walls, are slightly etched, so that the contact holes 19 to 22 are formed in self-alignment with the side wall spacers 10.

The insulating film to be formed over the memory cell selecting MISFETs and the n-channel MISFETs and p-channel MISFETs of the peripheral circuit should not be limited to the aforementioned silicon oxide film 16 but can be an ozone ($O_3$)-BPSG (Boron-doped Phospho Silicate Glass) film deposited at a filming temperature of about 450° C. by a CVD method, or an ozone-TEOS (Tatra Ethoxy Silane) film deposited at a filming temperature of about 400° C. by a CVD method. These insulating films are flattened at their surfaces by the chemical-mechanical polishing (CMP) method, as for the silicon oxide film 16.

Figure 9:
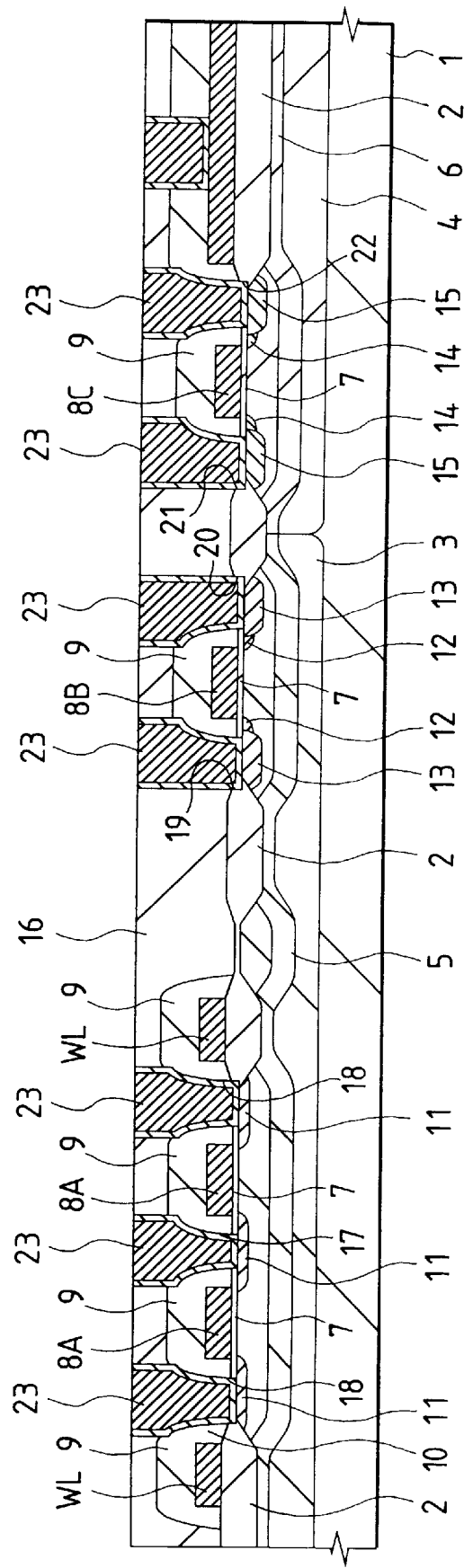

Next, as shown in FIG. 9, plugs 23, made of a multilayer film of titanium nitride (TiN) and W, are buried in the contact holes 17 to 22. These plugs 23 are formed by depositing a TiN film having a thickness of about 50 nm acting as an adhesive layer for the substrate and the W film over the silicon oxide film 16 by a sputtering method, by depositing the W film having a thickness of about 300 nm at a filming temperature of 475° C. over the TiN film by a CVD method, and by etching back the W film and the TiN film.

At this time, in order to reduce the contact resistance between the plugs 23 and the substrate, a Ti silicide (TiSi$_2$) film may be formed below the contact holes 17 to 22. This Ti silicide film is formed by depositing a Ti film having a thickness of about 50 nm over the silicon oxide film 16 by a sputtering method, by causing the Ti film and the semiconductor substrate below the contact holes 17 to 22 to react by annealing them at a temperature of about 800° C., and by wet-etching off the Ti film left unreacted over the silicon oxide film 16. After this, the TiN film and W film, deposited over the silicon oxide film 16, are etched back to form the plugs 23.

Figure 10:
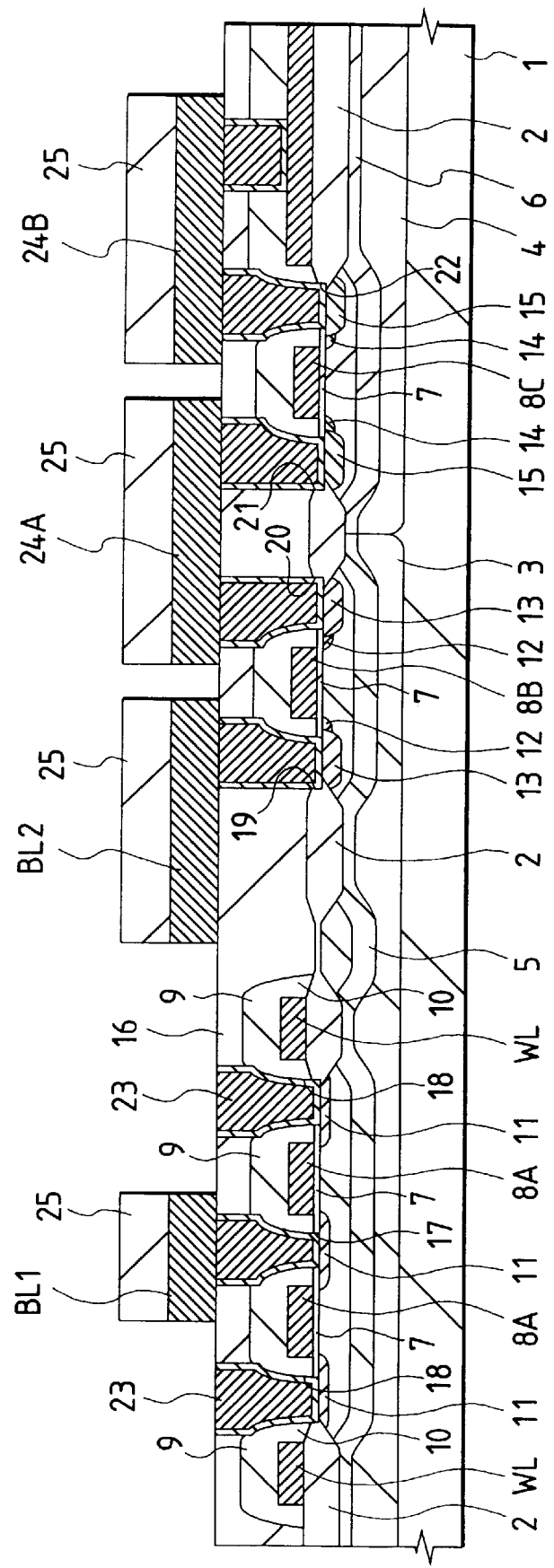

Next, as shown in FIG. 10, bit lines BL$_1$ and BL$_2$ and wiring lines 24A and 24B of the peripheral circuit are formed over the silicon oxide film 16. These bit lines BL$_1$ and BL$_2$ and the wiring lines 24A and 24B are simultaneously formed by depositing a W film having a thickness of about 300 nm at a filming temperature of about 475° C. over the silicon oxide film 16 by a plasma CVD method, by depositing a silicon nitride film 25 having a thickness of about 200 nm at a filming temperature of about 360° C. over that W film by a plasma CVD method, and by etching and patterning those films by using a photoresist as the mask.

The bit line BL$_1$ is electrically connected through the aforementioned contact hole 17 with one of the source region and the drain region (the n-type semiconductor regions 11) of the memory cell selecting MISFET. The bit line BL$_2$ is extended from the memory array region to the peripheral circuit region and is electrically connected through the aforementioned contact hole 19 with one of the source region and the drain region (the n$^+$-type semiconductor regions 13) of an n-channel MISFET Qn of the peripheral circuit.

One end of the wiring line 24A of the peripheral circuit is electrically connected through the contact hole 20 with the other (the n$^+$-type semiconductor region 13) of the source region and the drain region of the n-channel MISFET, and the other end of the wiring line 24A is electrically connected through the contact hole 21 with one of the source region and the drain region (the p$^+$-type semiconductor regions 15) of the p-channel MISFET. The wiring line 24B is electrically connected through the contact hole 22 with the other (the p$^+$-type semiconductor region 15) of the source region and the drain region of the p-channel MISFET.

Figure 11:
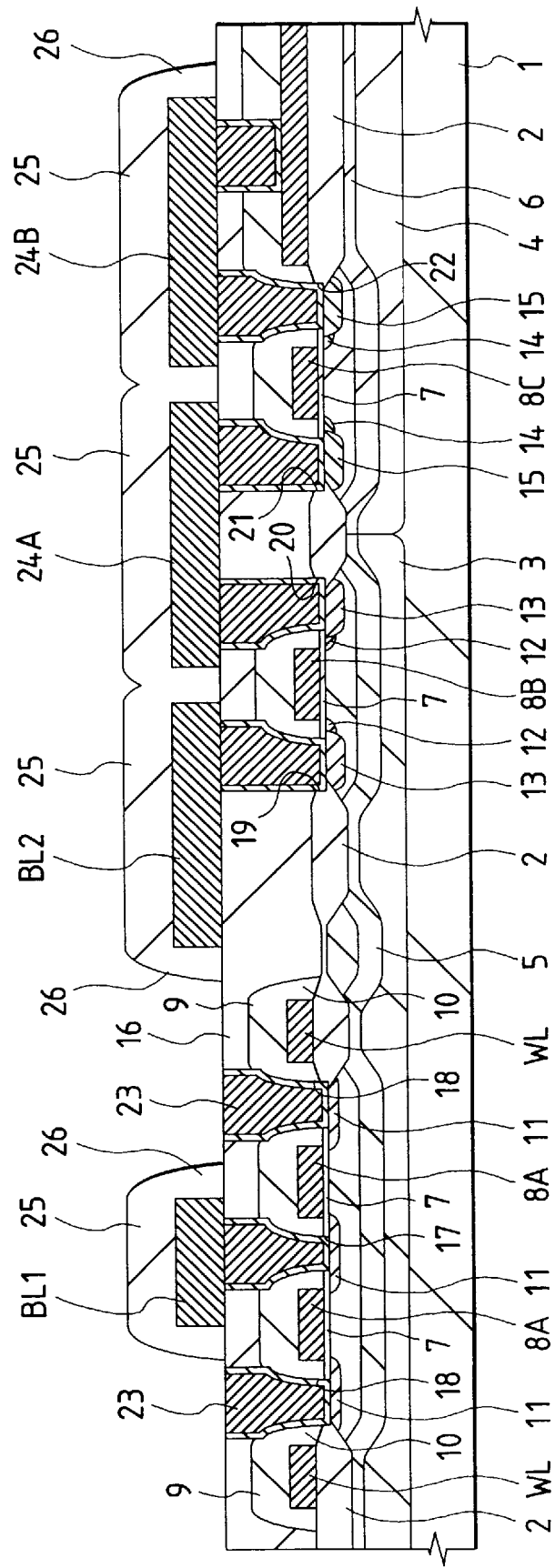

Next, as shown in FIG. 11, side wall spacers 26 are formed at the individual side walls of the bit lines BL$_1$ and BL$_2$ and the wiring lines 24A and 24B. These side wall spacers 26 are formed by depositing a silicon nitride film having a thickness of about 100 nm at a filming temperature of about 360° C. over the silicon oxide film 16 by a plasma CVD method, and by working the silicon nitride film by an anisotropic etching method.

Figure 12:
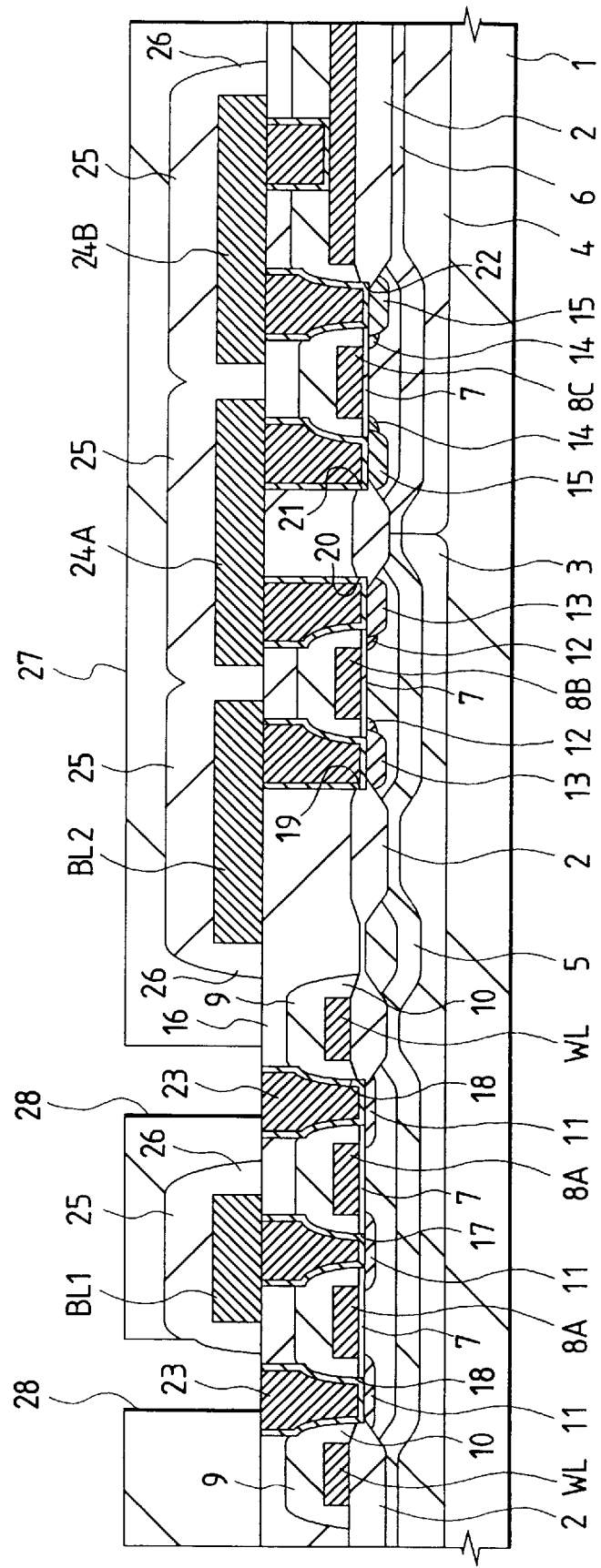

Next, as shown in FIG. 12, contact holes 28 for exposing the plugs 23 in the contact holes 18 to the outside are formed over the contact holes 18, formed to expose the upper portion of one of the n-type semiconductor regions 11 (the source region and the drain region) of the memory cell selecting MISFET, by depositing a silicon oxide film 27 having a thickness of about 500 nm at a filming temperature of about 390° C over the bit lines BL$_1$ and BL$_2$ and the wiring lines 24A and 24B by a plasma CVD method, by polishing the silicon oxide film 27 by a chemical mechanical polishing (CMP) method to flatten its surface, and by etching the silicon oxide film 27 by using a photoresist as a mask. At this time, the silicon oxide film 25, formed over the bit line BL$_1$, and the side wall spacers 26 of silicon nitride, formed at the side walls, are slightly etched so that the contact holes 28 are formed in self-alignment with the side wall spacers 26.

The insulating film to be deposited over the bit lines $BL_1$ and $BL_2$ and the wiring lines 24A and 24B should not be limited to the aforementioned silicon oxide film 27 but can be the aforementioned ozone-BPSG film or ozone-TEOS film, or an SOG (Spin On Glass) film. The ozone-BPSG film or ozone-TEOS film is flattened, if employed, on its surface by a chemical mechanical polishing (CMP) method such as used for the silicon oxide film 27.

Figure 13:
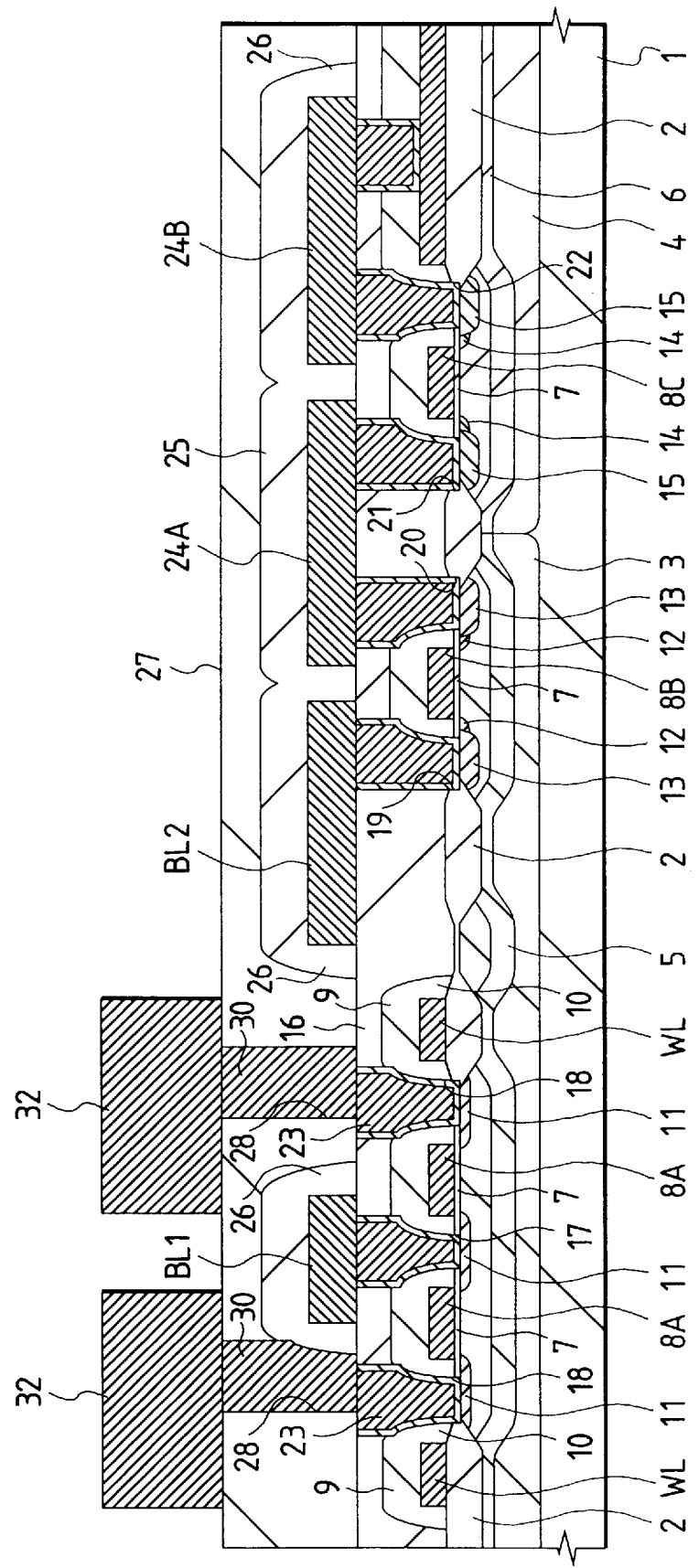

Next, as shown in FIG. 13, W plugs 30 are buried in the contact holes 28, and storage electrodes (lower electrodes) 32 of information storing capacitive elements are formed over the contact holes 28. The W plugs 30 are formed by depositing a W film having a thickness of about 300 nm at a filming temperature of about 500° C. over the silicon oxide film 27 by a CVD method, and by etching back the W film. The storage electrodes 32 are formed by depositing a W film having a thickness of about 500 nm at a filming temperature of about 475° C. over the silicon oxide film 27 by a CVD method, and by pattering the W film by using a photoresist as a mask. The W film constituting the plugs 30 is deposited at a higher filming temperature (500° C.) than that (475° C.) of the W film constituting the storage electrodes 32, because it is required to retain the coverage of the inside of the contact holes 28.

Figure 14:
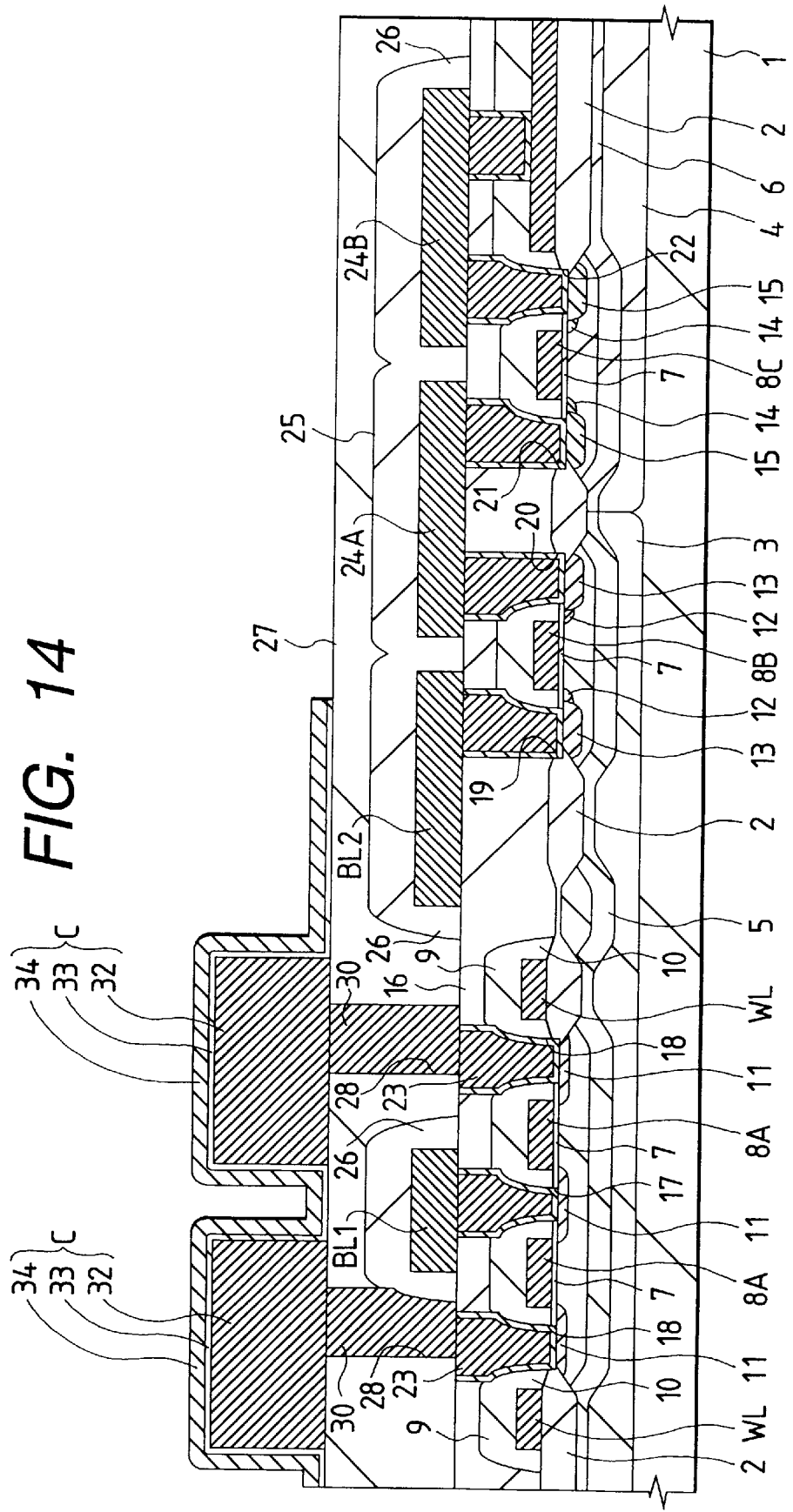

Next, as shown in FIG. 14, there are formed over the storage electrodes 32, a capacitor insulating film 33 and plate electrodes (upper electrodes) 34 of the information storing capacitive elements. The capacitor insulating film 33 and the plate electrodes 34 are simultaneously formed by depositing a $Ta_2O_5$ film having a thickness of about 15 nm at a filming temperature of about 400 to 480° C. over the storage electrodes 32 by a CVD method, by depositing a TiN film having a thickness of about 150 nm over the $Ta_2O_5$ film by a sputtering method, and by etching and patterning those films by using a photoresist as a mask. As a result, there is formed an information storing capacitive element C of the memory cell, which is composed of the storage electrode 32, the capacitor insulating film 33 and the plate electrode 34.

Figure 15:
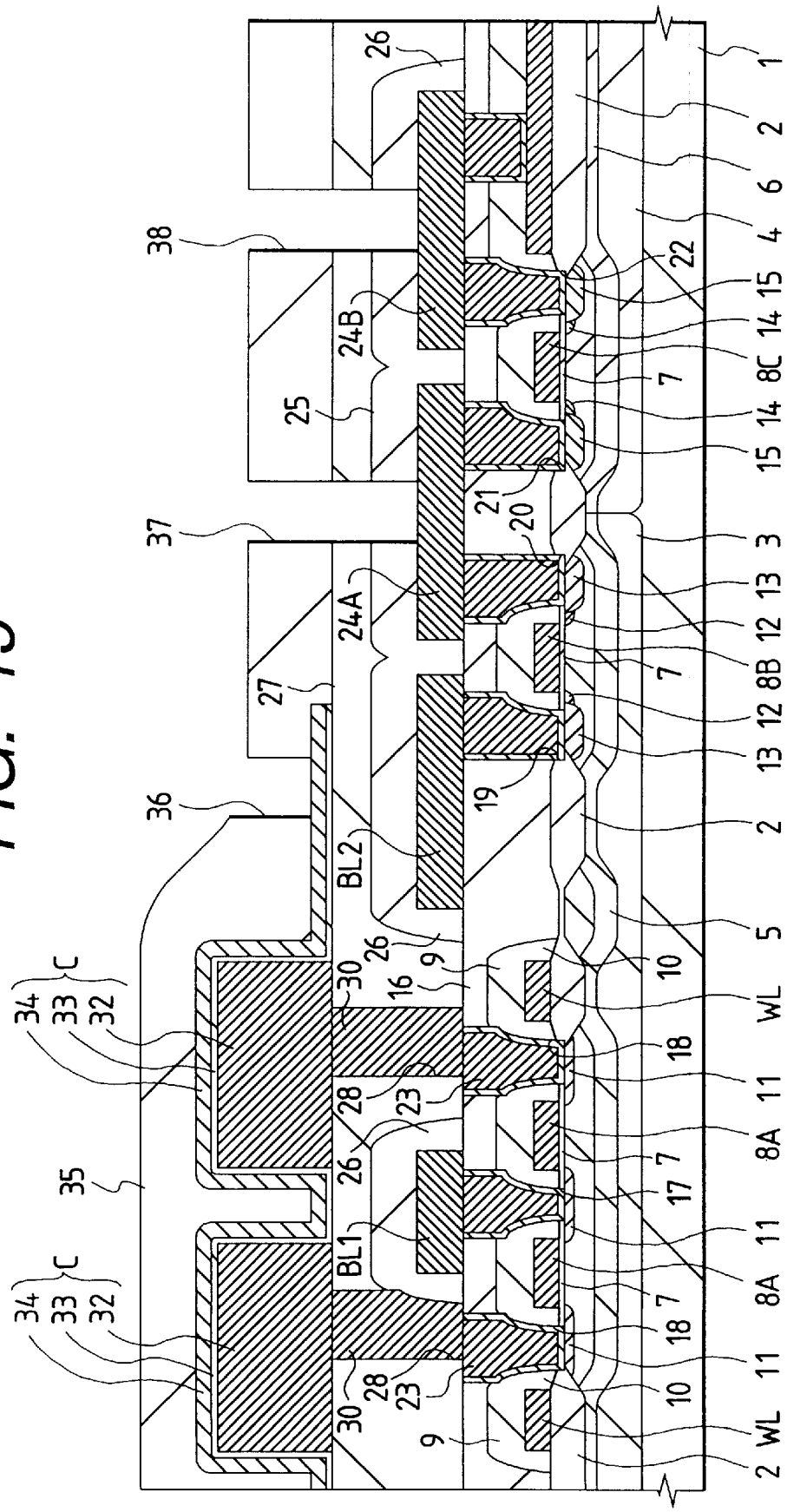

Next, as shown in FIG. 15, a contact hole 36 is formed over the plate electrode 34 of the information storing capacitive element C by depositing a silicon oxide film 35 having a thickness of about 500 nm at a filming temperature of about 390° C. over the information depositing capacitive element C by a plasma CVD method, and by etching the silicon oxide film 35 by using a photoresist as a mask. Simultaneously with this, a contact hole 37 is formed over the wiring line 24A of the peripheral circuit, and a contact hole 38 is formed over the wiring line 24B, by etching the silicon oxide film 35, the silicon oxide film 27 and the silicon nitride film 25. The insulating film to be deposited over the information storing capacitive element C should not be limited to the aforementioned silicon oxide film 35 but can be a three-layered insulating film in which a spin-on-glass film is sandwiched between the two silicon oxide films 35.

Figure 16:
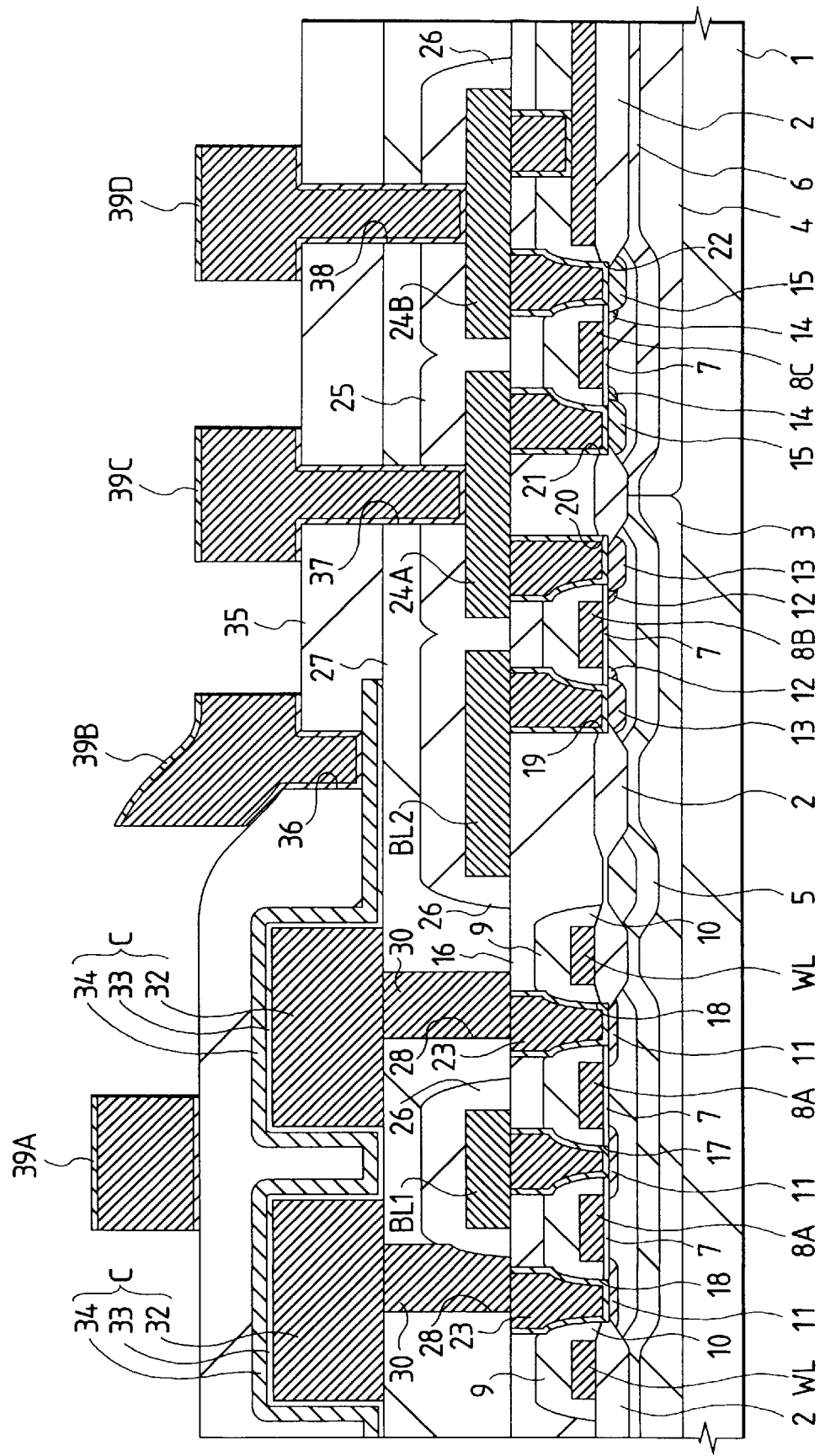
Figure 23:
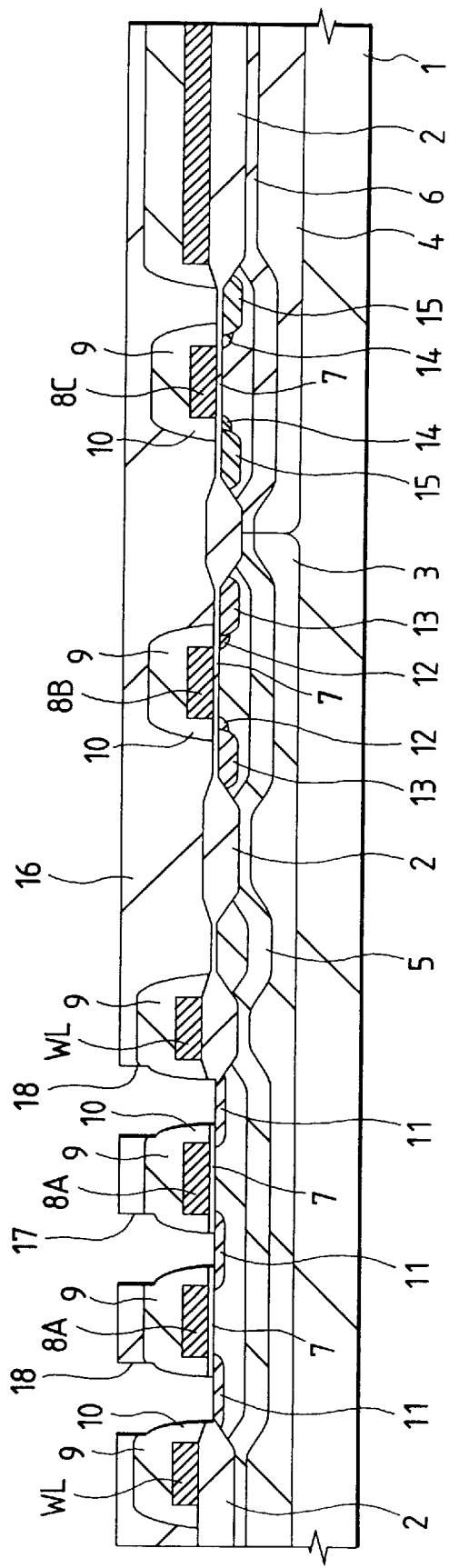
FIGS. 23 to 33 are section views of an essential portion of a semiconductor substrate and show respective steps of a process for manufacturing a semiconductor integrated circuit device representing an Embodiment 4 of the present invention.

Next, as shown in FIG. 16, wiring lines 39A, 39B, 39C and 39D are formed over the silicon oxide film 35. These wiring lines 39A, 39B, 39C and 39D are simultaneously formed by depositing a TiN film having a thickness of about 50 nm, an Al (aluminum) alloy film having a thickness of about 500 nm and a TiN film having a thickness of about 10 nm over the silicon oxide film 35 at a substrate temperature of 300 to 350° C. by a sputtering method, and etching and patterning those films by using a photoresist as a mask. By the steps thus far described, the DRAM of the present embodiment is substantially completed.

By the DRAM manufacturing process of the present embodiment, at the step after formation of the individual source regions and drain regions of the memory cell selecting MISFET and the n-channel MISFET and the p-channel MISFET of the peripheral circuit, the wiring conductive film and the insulating film are deposited at a temperature of 500° C. or lower, so that the diffusion of the impurity into the substrate by the high-temperature heat treatment can be suppressed to realize a shallow junction between the source regions and the drain rations thereby to enhance the high performance of the DRAM.

By the DRAM manufacturing process of the present embodiment, all of the wiring conductive films are made of metal materials (W or Al) or the metal compound material (TiN) so that the wiring resistance which may rise because of the miniaturization, can be lowered to increase the speedup of the DRAM. The wiring conductive film should not be limited to the material employed in the present embodiment but can be made of Ti or copper (Cu), for example.

(Embodiment 2)

In the foregoing Embodiment 1, the gate electrodes 8A of the memory cell selecting MISFET and the gate electrodes 8B of the n-channel MISFET and the gate electrodes 8C of the p-channel MISFET of the peripheral circuit are individually composed of the tungsten (W) film which is deposited at the filming temperature of about 475° C. In the present embodiment, however, the gate electrodes 8A (the word lines WL) and the gate electrodes 8B and 8C are composed of a multilayer film of a polycrystalline silicon film, a titanium nitride (TiN) film and a tungsten (W) film, as shown in FIG. 17.

In this case, the polycrystalline silicon film having a thickness of about 250 nm is deposited at first at a filming temperature of about 540° C. by a CVD method, and the titanium nitride (TiN) having a thickness of about 50 nm for an adhesive layer between the polycrystalline silicon film and the tungsten (W) film is then deposited over the polycrystalline silicon film by a sputtering method. The polycrystalline silicon film is doped with an n-type impurity or phosphor (P) of about $1.5 \times 10^{20}$ $cm^{-3}$. The titanium nitride prevents the polycrystalline silicon film and the tungsten (W) film from reacting to form a tungsten silicide (WSi) film. This is because the resistance rises if the tungsten turns into tungsten silicide.

Next, the gate electrodes 8A (the word lines WL) and the gate electrodes 8B and 8C are simultaneously formed by depositing a W film having a thickness of about 100 nm at a filming temperature of about 475° C. over the TiN film by a CVD method, by depositing the silicon nitride film 9 having a thickness of about 250 nm at a filming temperature of about 360° C. over the W film by a plasma CVD method, and by etching and patterning the silicon nitride film 9, the W film, the TiN film and the polycrystalline silicon film by using a photoresist as a mask. The other steps are identical to those of the foregoing Embodiment 1, and a DRAM is completed by applying the steps after the step of forming the gate electrodes 8A, 8B and 8C.

By the DRAM manufacturing process of the present embodiment, the wiring conductive film and the insulating film are deposited at a temperature of 500° C. or lower after the individual source regions and drain regions of the memory cell selecting MISFET and the n-channel MISFET and the p-channel MISFET of the peripheral circuit have been formed, so that the high performance of the DRAM can be enhanced.

By the DRAM manufacturing process of the present embodiment, the high speed of the DRAM can be increased as in Embodiment 1 by making all the wiring conductive films of a material containing a metal material or a metal compound.

(Embodiment 3)

In order to manufacture a DRAM of the present embodiment, as shown in FIG. 18, the surface of the semiconductor substrate 1 of p$^-$-type single crystal silicon is thermally oxidized at first to form a thin silicon oxide film 43, and a silicon nitride film 44 is then deposited over the silicon oxide film 43 by a CVD method. The silicon nitride film 44 is etched by using a photoresist as a mask, and it is removed from the element isolating region.

Next, as shown in FIG. 19, the semiconductor substrate 1 at the element isolating region is etched by using the silicon nitride film 44 as a mask to form shallow grooves 52 having a depth of about 0.35 μm, and a silicon oxide film 53 having a thickness of about 10 nm is then formed in the shallow groove 52.

Next, as shown in FIG. 20, a silicon oxide film 54 is buried in the shallow groove 52. In order to bury the silicon oxide film 54 in the shallow groove 52, the silicon oxide film 54 having a thickness of about 600 nm is deposited over the semiconductor substrate 1 by a CVD method and is then polished by a chemical-mechanical polishing (CMP) method. After this, the silicon nitride film 44, left over the semiconductor substrate 1, is etched off.

Next, as shown in FIG. 21, a p-type well 3 is formed by doping the semiconductor substrate 1 with ions of a p-type impurity or boron (B) by using the (not-shown) photoresist for exposing the region for forming the memory array and the region for forming the n-channel MISFET of the peripheral circuit selectively to the outside, and the n-type well 4 is formed by doping the semiconductor substrate 1 with ions of an n-type impurity or phosphor (P) by using the (not-shown) photoresist exposing the region for forming the p-channel MISFET of the peripheral circuit selectively to the outside. For this doping, the peaks of the individual distributions of the n-type impurity and the p-type impurity are substantially equalized to the depth of the shallow groove 52, so that the p-type or n-type semiconductor regions are formed in the semiconductor substrate at the bottom of the shallow groove 52. As a result, the p-type well 3 acts as a p-type channel stopper layer, and the n-type well 4 acts as an n-type channel stopper layer.

Next, as shown in FIG. 22, the surfaces of the individual active regions of the p-type well 3 and the n-type well 4, enclosed by the shallow groove 52, are thermally oxidized at a temperature of about 800° C. to form the gate oxide film 7 having a thickness of about 8 nm. The subsequent steps are identical to those of Embodiment 1.

By the DRAM manufacturing process of the present embodiment, the p-type well 3 acts as the p-type channel stopper layer whereas the n-type well 4 acts as the n-type channel stopper layer. As a result, the ion implantation for forming the p-type channel stopper layer and the ion implantation for forming the n-type channel stopper layer can be eliminated to simplify the DRAM manufacturing process more than the process of Embodiment 1.

By the DRAM manufacturing process of the present embodiment, the elements are isolated by the shallow groove 52, formed in the semiconductor substrate 1, so that the miniaturization of the DRAM can be promoted. Since the step between the element isolating region and the active region is eliminated, moreover, it is possible to prevent the drawback that the conductive film such as the gate electrode material, deposited over the semiconductor substrate 1, is thinned at the step portion.

Moreover, the step between the element isolating region and the active region can be made less than the LOCOS of the prior art so that a microminiaturization process can be performed at the step of patterning the conductive film such as the gate electrode material deposited over the semiconductor substrate.

The present embodiment can be combined with other Embodiments of the present invention, (Embodiment 4)

In order to manufacture the DRAM of the present embodiment, employing the manufacturing process of Embodiment 1, the contact holes 17 and 18 for exposing a portion of the semiconductor region 11 are formed by forming the memory cell selecting MISFET, and the n-channel MISFET and the p-channel MISFET of the peripheral circuit, by depositing the silicon oxide film 16 over those MISFETs, by polishing the silicon oxide film 16 using a chemical mechanical-polishing (CMP) method to flatten its surface, and by etching the silicon oxide film 16 and the gate oxide film 7 using a photoresist as a mask to form the contact holes 17 and 18 over the n-type semiconductor region 11 (the source region and the drain region) of the memory cell selecting MISFET.

This not-shown photoresist mask is patterned to cover the peripheral circuit forming region and to have openings over the n-type semiconductor region 11 or the source and drain of the memory cell selecting MISFET.

Figure 24:
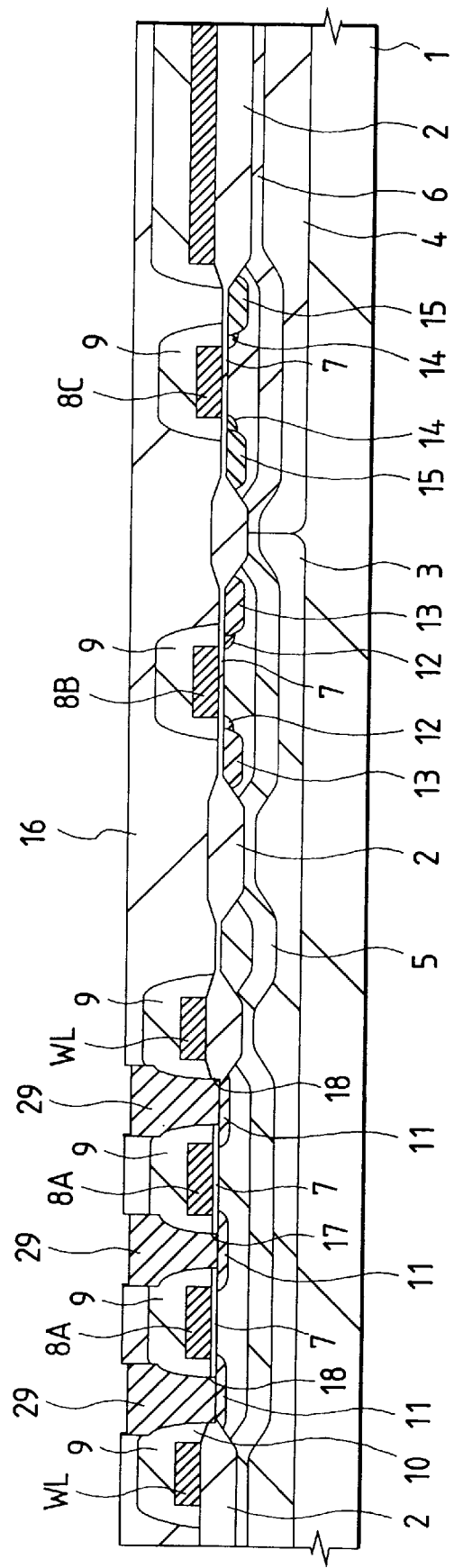

Next, as shown in FIG. 24, the plugs 29 of polycrystalline silicon are buried in the contact holes. These plugs 29 are formed by depositing the polycrystalline silicon film having a thickness of about 360 nm at a filming temperature of about 540° C. over the silicon oxide film 16 by a CVD method, and by etching back the polycrystalline silicon film (while leaving the polycrystalline silicon film only in the contact holes 17 and 18). This polycrystalline silicon film is doped with an n-type impurity of phosphor (P).

Figure 25:
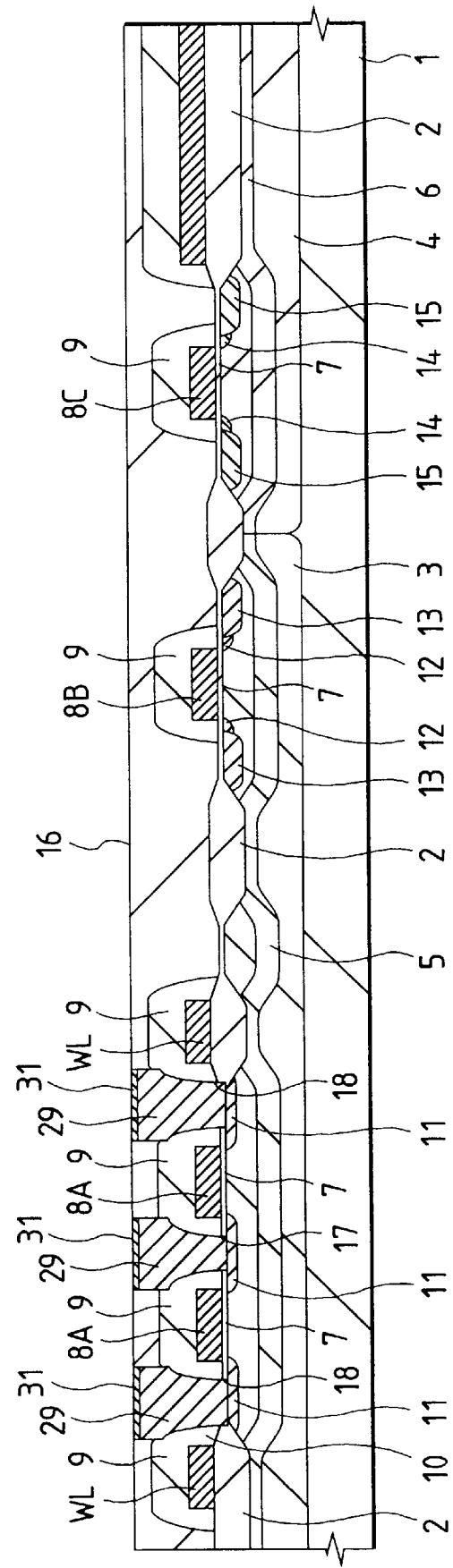

Next, as shown in FIG. 25, a titanium (Ti) silicide layer 31 is formed on the surfaces of plugs 29 of polycrystalline silicon. The titanium silicide layer 31 is formed by burying the polycrystalline silicon plugs 29 in the contact holes 17 and 18, by depositing, just after the burying step, a Ti film having a thickness of about 50 nm over the silicon oxide film 16 by a sputtering method, by annealing the Ti film and the polycrystalline silicon (the plugs 29) at a temperature of about 800° C. to react, and by removing the Ti film, left unreacted over the silicon oxide film 16, by wet etching.

Figure 26:
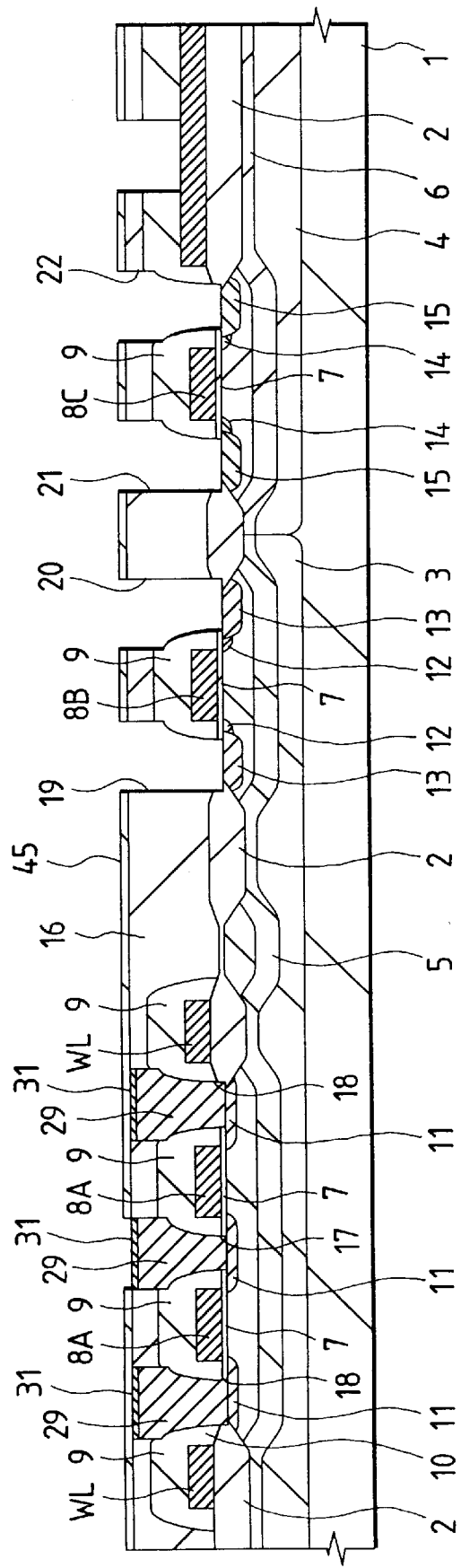

Next, as shown in FIG. 26, the contact holes 19 and 20 are formed over the n$^+$-type semiconductor region 13 (the source region and the drain region) of the n-channel MISFET of the peripheral circuit, and the contact holes 21 and 22 are formed over the p$^+$-type semiconductor region 15 (the source region and the drain region) of the p-channel MISFET, by depositing a silicon oxide film 45 having a thickness of about 50 nm at a filming temperature of about 360° C. over the silicon oxide film 16 by a plasma CVD method, and by etching the silicon oxide film 45, the silicon oxide film 16 and the gate oxide film 7 by using as a mask a photoresist covering the memory cells and having openings over the semiconductor regions 13 of the n-channel MISFET and the semiconductor regions 15 of the p-channel MISFET of the peripheral circuit region.

Figure 27:
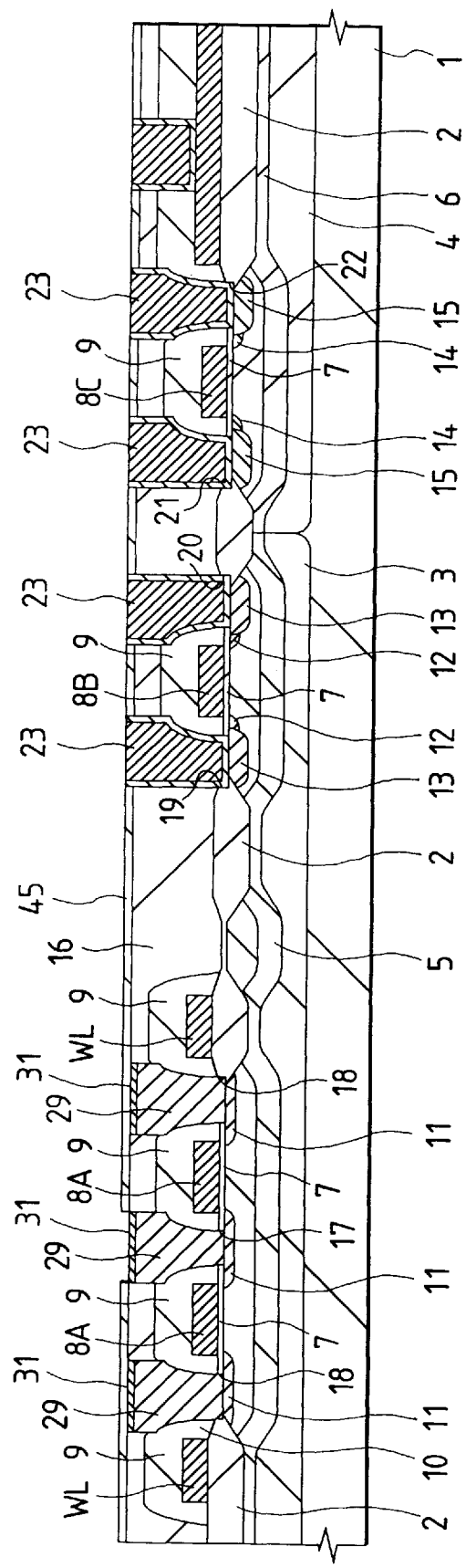
Figure 28:
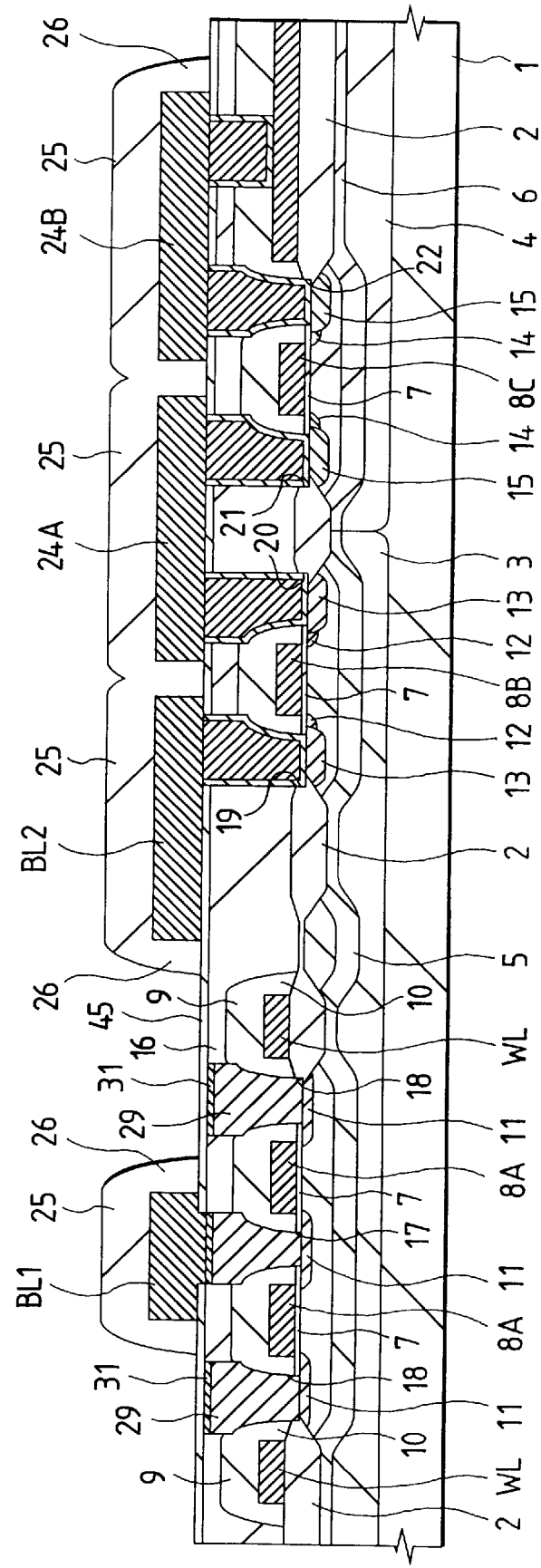

Next, as shown in FIG. 27, the plugs 23, composed of the multilayer film of TiN and W, are buried in the contact holes 19 to 22 of the peripheral circuit in accordance with the process of Embodiment 1. After this, the silicon oxide film 45 of the contact holes 17, formed over one (located at the side for connecting the bit lines) of the n-type semiconductor regions 11 (the source region and the drain region) of the memory cell selecting MISFET, is removed to expose the surface of the titanium silicide layer 31, formed over the surfaces of the plugs 29, to the outside. After this, as shown in FIG. 28, the bit lines $BL_1$ and $BL_2$ and the wiring lines 24A and 24B of the peripheral circuit are formed over the silicon oxide film 45, and the side wall spacers 26 are then formed at the individual side walls of the bit lines $BL_1$ and $BL_2$ and the wiring lines 24A and 24B. The methods for forming the insulating film 25 over the bit lines $BL_1$ and $BL_2$ and the side wall spacers 26 are similar to those of Embodiment 1.

Figure 29:
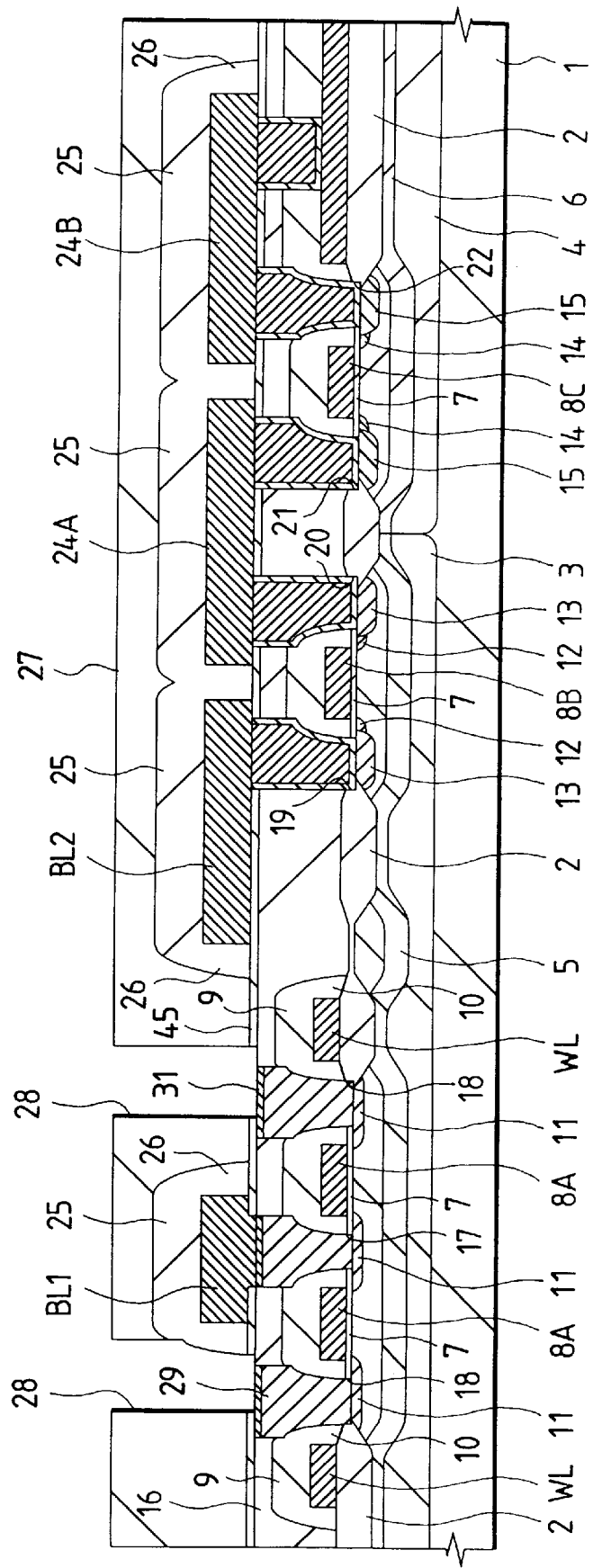

Next, as shown in FIG. 29, by the process of Embodiment 1, the contact holes 28 are formed in self-alignment with the side wall spacers 26 of the side walls of the bit lines $BL_1$ and $BL_2$ over the aforementioned contact holes 18, formed over one of the n-type semiconductor regions 11 (the source region and the drain region) of the memory cell selecting MISFET, by depositing the silicon oxide film 27 individually over the bit lines $BL_1$ and $BL_2$ and the wiring lines 24A and 24B, by polishing and flattening the surface of the silicon oxide film 27 by a chemical-mechanical polishing (CMP) method, and by etching the silicon oxide film 27 by using a photoresist as a mask.

Figure 30:
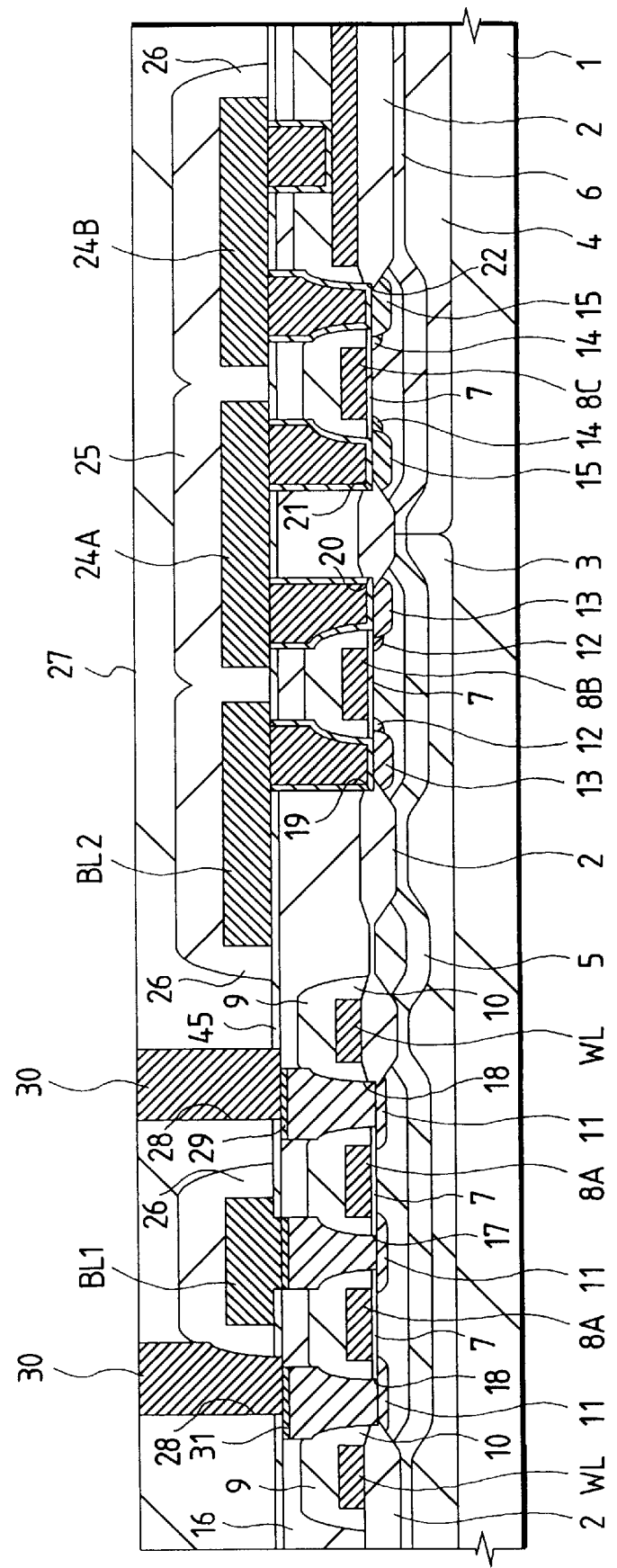

Next, as shown in FIG. 30, foreign matter on the surface of the aforementioned Ti silicide layer 30, exposed at the bottoms of the contact holes 28, is removed by a sputter-etching method using argon (Ar), and the plugs 30 of polycrystalline silicon or W are buried in the contact holes 28. If, at this time, the Ti silicide film 31 is not formed on the surfaces of the polycrystalline silicon plugs 29, the contact resistance is increased between the surfaces of the plugs 29 (of polycrystalline silicon) are oxidized at the time of burying the plugs 30 in the contact holes 28. If, at this time, wet etching is executed to remove the oxide film from the surfaces of the plugs 29 (of polycrystalline silicon), the insulating film 27 in the bottoms and at the sides of the contact holes 28 are side-etched to cause a shape defect to occur in the contact holes 28. For the plugs 29 made of polycrystalline silicon, the oxide film to be formed over the surfaces cannot be removed by a dry etching method, but a wet etching method is essential.

By the DRAM manufacturing process of the present embodiment, the Ti silicide layer 31 is formed on the surfaces of the aforementioned polycrystalline silicon plugs 29, buried in the contact holes 18, is formed to reduce the oxidation of the surfaces of the plugs 29 (polycrystalline silicon) so that the oxide film can be removed not by an isotropic wet etching method but only by a dry etching method using Ar. As a result, there arises none of the aforementioned problems. In short, the contact resistance can be reduced without causing a shape defect to occur in the contact holes 28.

In order to prevent the oxidation of the surfaces of the plugs 29 (polycrystalline silicon), a metal film of Ti or the like may be selectively grown on the surfaces of the polycrystalline silicon plugs 29 immediately after the plugs 29 have been buried in the contact holes 17 and 18.

Figure 31:
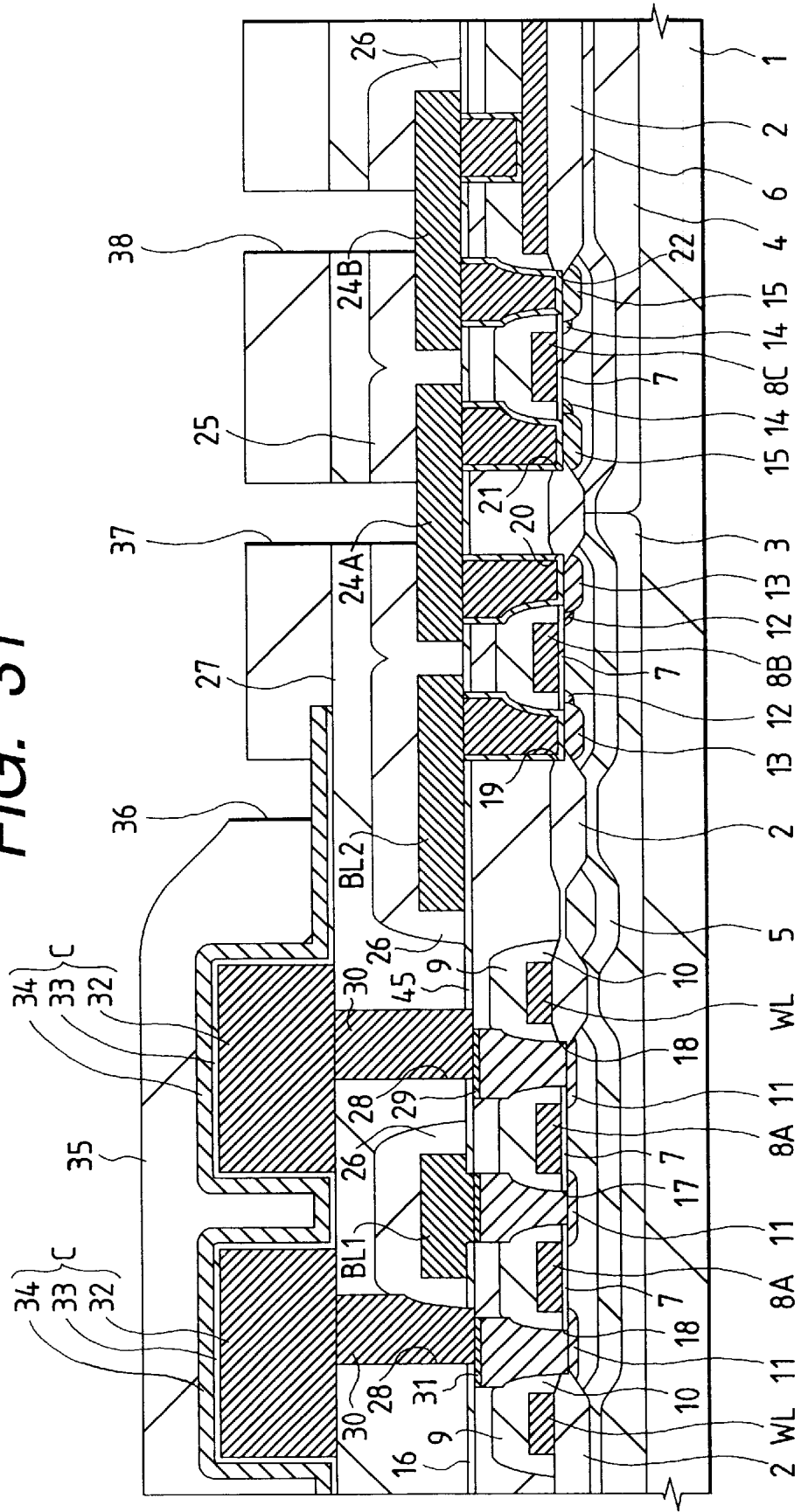

Next, as shown in FIG. 31, by the process of Embodiment 1, the contact holes 36 are formed over the plate electrodes 34 of the information storing capacitive element C after forming the information storing capacitive element C over the contact holes 28, by depositing the silicon oxide film 35 over the information storing capacitive element C, and by etching the silicon oxide film 35 by using a photoresist as a mask. Simultaneously with this, by etching the silicon oxide film 35 and the silicon oxide film 27, the contact holes 37 are formed over the wiring lines 24A of the peripheral circuit, and the contact holes 38 are formed over the wiring lines 24B.

Figure 32:
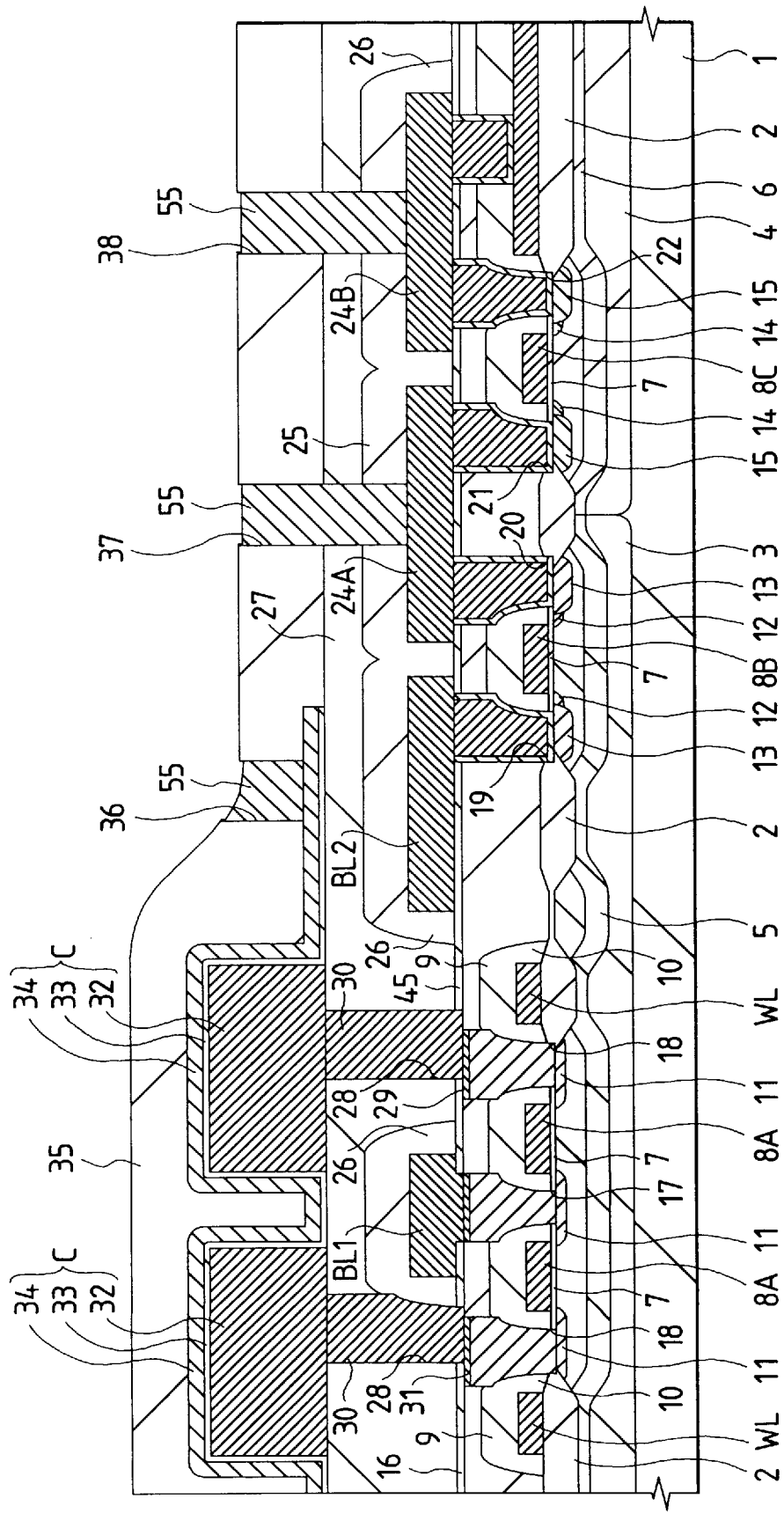

Next, as shown in FIG. 32, plugs 55 of TiN are buried in the contact holes 35, 36 and 37. These TiN plugs 55 are formed by depositing the TiN film over the silicon oxide film 35 by using a sputtering method and a CVD method, and by etching back the TiN film.

If the plugs 55 are composed of a multilayer film of TiN and W, the TiN film and the W film are deposited over the silicon oxide film 35 and are then etched back. In this case, TiN and W have different etching rates so that the surface of the W film, buried in the contact holes 36, 37 and 38, is excessively etched off if the TiN film over the silicon oxide film 35 is completely removed. This may cause breakage of Al wiring lines over the contact holes 36, 37 and 38 if the Al wiring lines are formed over the silicon oxide film 35. If the TiN film is not completely etched off, but is left over the silicon oxide film 35, on the other hand, separation may occur at the interface between the TiN film and the Al wiring lines when these wiring lines are formed thereover.

By the DRAM manufacturing process of the present embodiment, the aforementioned drawbacks can be avoided by making the plug material to be buried in the contact holes 36, 37 and 38, of a single layer of TiN.

Figure 33:
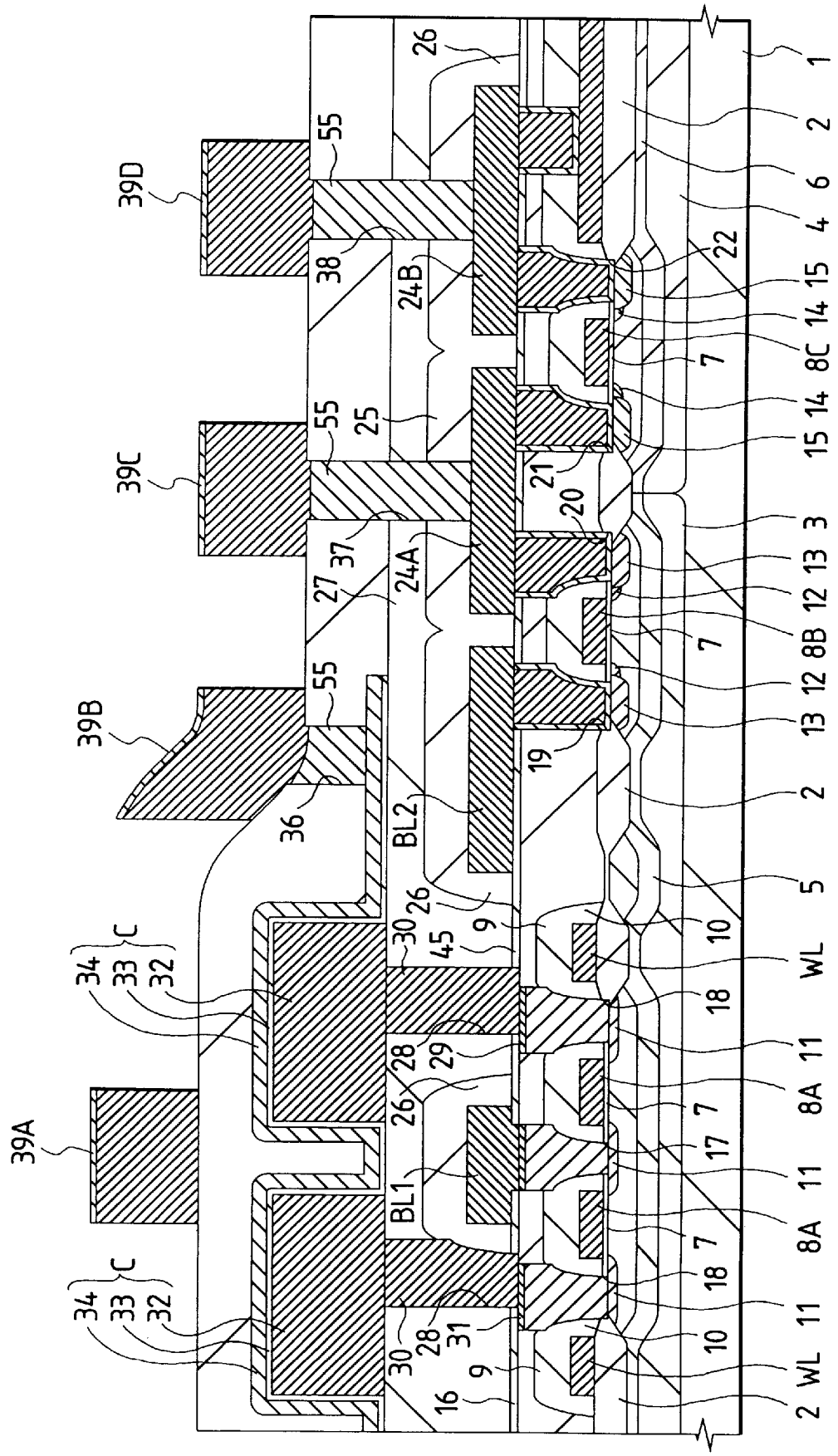

Next, as shown in FIG. 33, the wiring lines 39A, 39B, 39C and 39D are formed over the silicon oxide film 35. Specifically, these wiring lines 39A, 39B, 39C and 39D are formed by depositing an Al alloy film having a thickness of about 500 nm and a TiN film having a thickness of about 10 nm over the silicon oxide film 35 by a sputtering method, and by etching and patterning those films by using a photoresist as a mask. After the steps thus far described, the DRAM of the present embodiment is substantially completed. It is needless to say that Embodiments 2 and 3 can be applied to the present embodiment.

(Embodiment 5)

In the DRAM of the present embodiment, the conductive material (TiN) constituting the plate electrodes 34 of the information storing capacitive element C is used as the material for the wiring lines of the peripheral circuit, and the plate electrodes 34 and the wiring lines of the peripheral circuits are formed in a common step.

Figure 34:
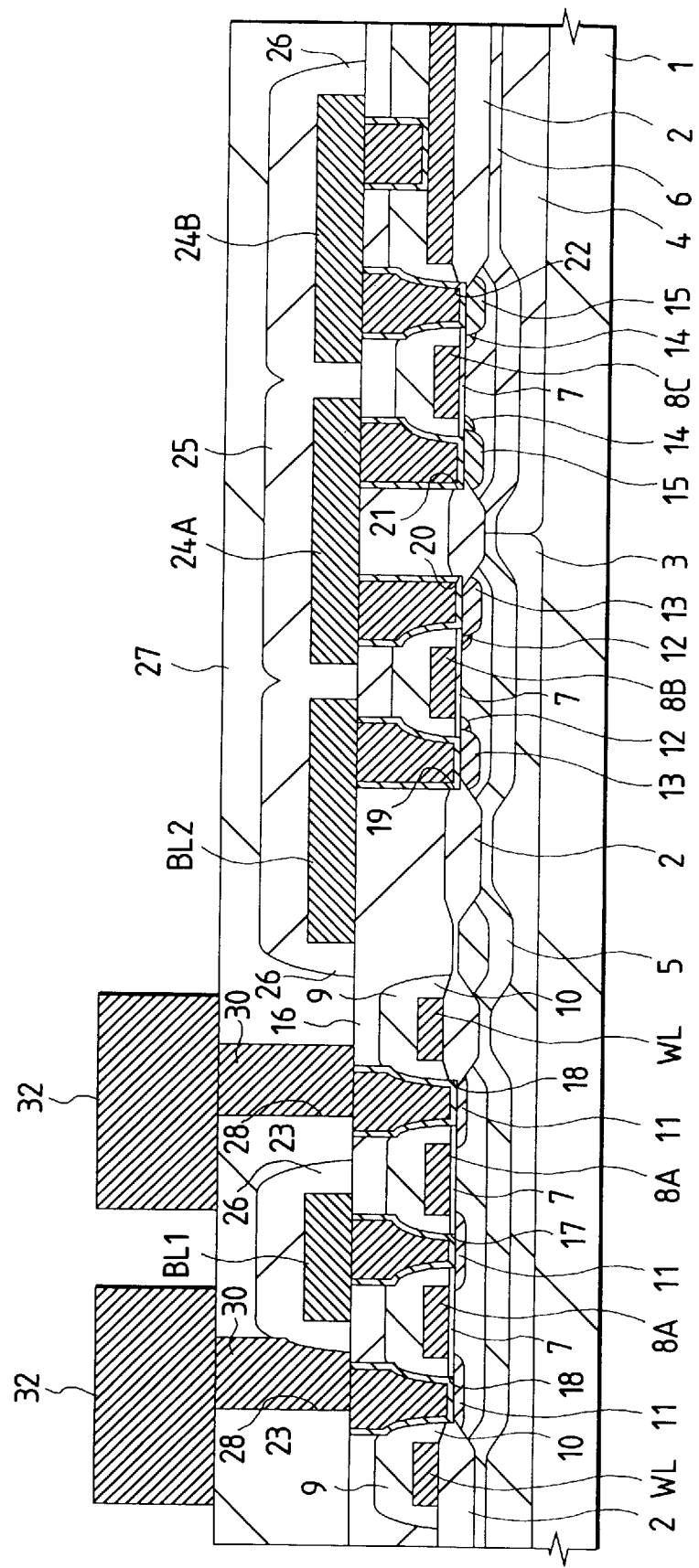
FIGS. 34 to 37 are section views of an essential portion of a semiconductor substrate and show respective steps of a process for manufacturing a semiconductor integrated circuit device representing an Embodiment 5 of the present invention.
Figure 35:
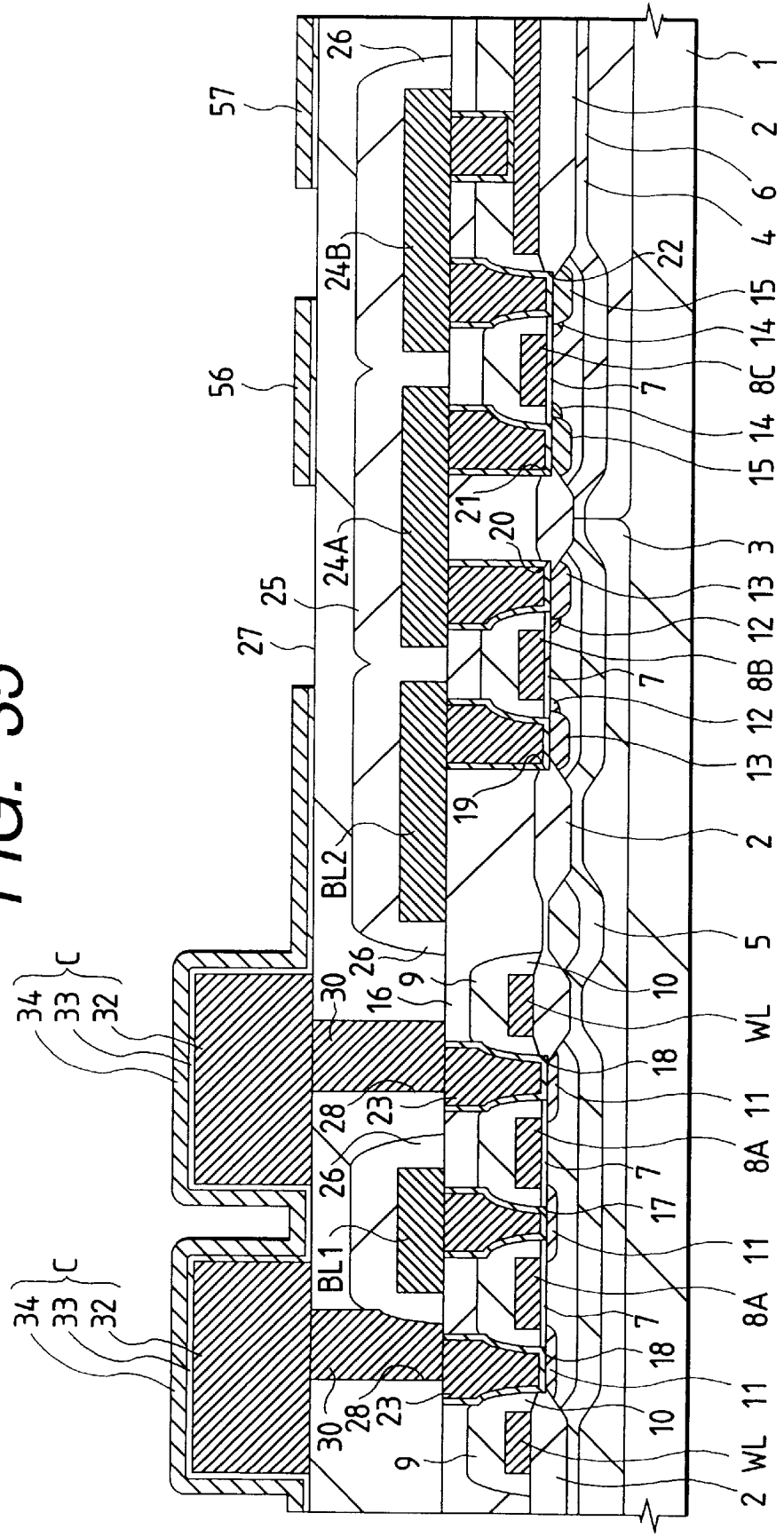

For manufacturing this DRAM by the manufacturing of Embodiment 1, the capacitor insulating film 33 and the plate electrodes 34 of the information storing capacitive element C are formed simultaneously with wiring lines 56 and 57 of the peripheral circuit, by forming the storage electrodes 32 of the information storing capacitive element over the silicon oxide film 27, deposited over the bit lines $BL_1$ and $BL_2$ and the wiring lines 24A and 24B of the peripheral circuit, as shown in FIG. 34, and by patterning the $Ta_2O_5$ film and the TiN film deposited over the storage electrodes 32, as shown in FIG. 35.

The wiring lines 56 and 57, formed of the multilayer film of the $Ta_2O_5$ film or the capacitor insulating film and the TiN film deposited over the former, cannot be connected directly with the underlying wiring lines through the contact holes. In this case, if the TiN film is deposited after the $Ta_2O_5$ has been deposited and then etched off from the peripheral circuit, the direct connection with the underlying wiring lines can be made but increases the number of steps. Since the $Ta_2O_3$ is partially etched off, moreover, the reliability of the capacitor insulating film may drop. Specifically, a photoresist film of a predetermined pattern is formed over the capacitor insulating film 33, and this capacitor insulating film 33 is etched. After this, the quality of the capacitor insulating film 33 is deteriorated by the ashing treatment with $O_2$ for removing the photoresist. In the present embodiment, therefore, the wiring lines 58 and 57 and the underlying wiring lines are connected by the following method.

Figure 36:
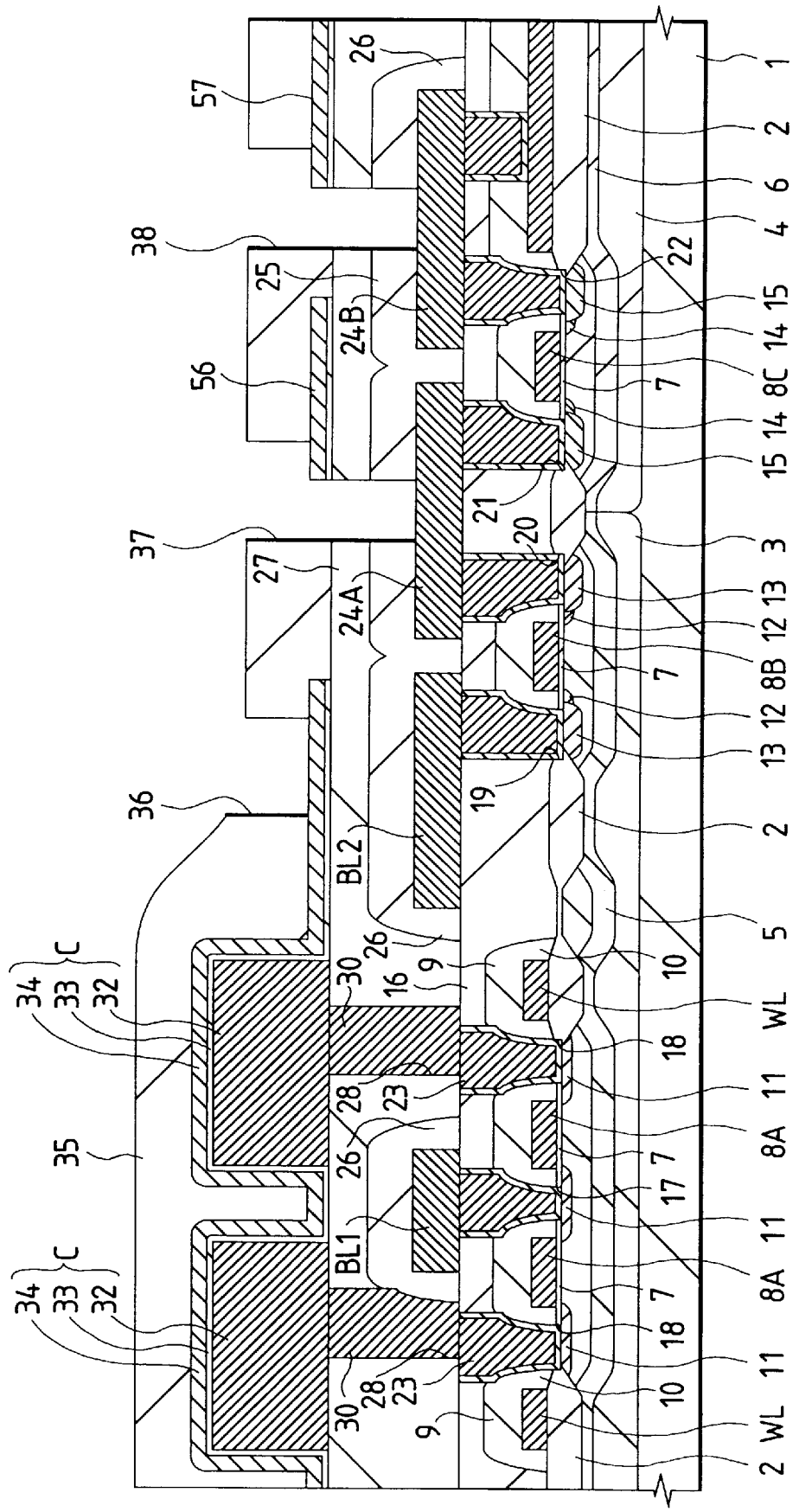

First of all, as shown in FIG. 36, the contact holes 36 are formed over the plate electrodes 34 of the information storing capacitive element C by depositing the silicon oxide film 35 over the information storing capacitive element C and the wiring lines 56 and 57, and by etching the silicon oxide film 35 by using a photoresist as a mask. Simultaneously with this, the contact holes 37 are formed over the wiring lines 24A of the peripheral circuit, and the contact holes 38 are formed over the wiring lines 24B, by etching the silicon oxide film 35, the silicon oxide film 27 and the silicon nitride film 25 in the regions having the wiring lines 56 and 57. At this time, one end of the wiring line 56 is exposed to the inside of the contact hole 37, and one end of the wiring line 57 is exposed to the inside of the contact hole 38.

Figure 37:
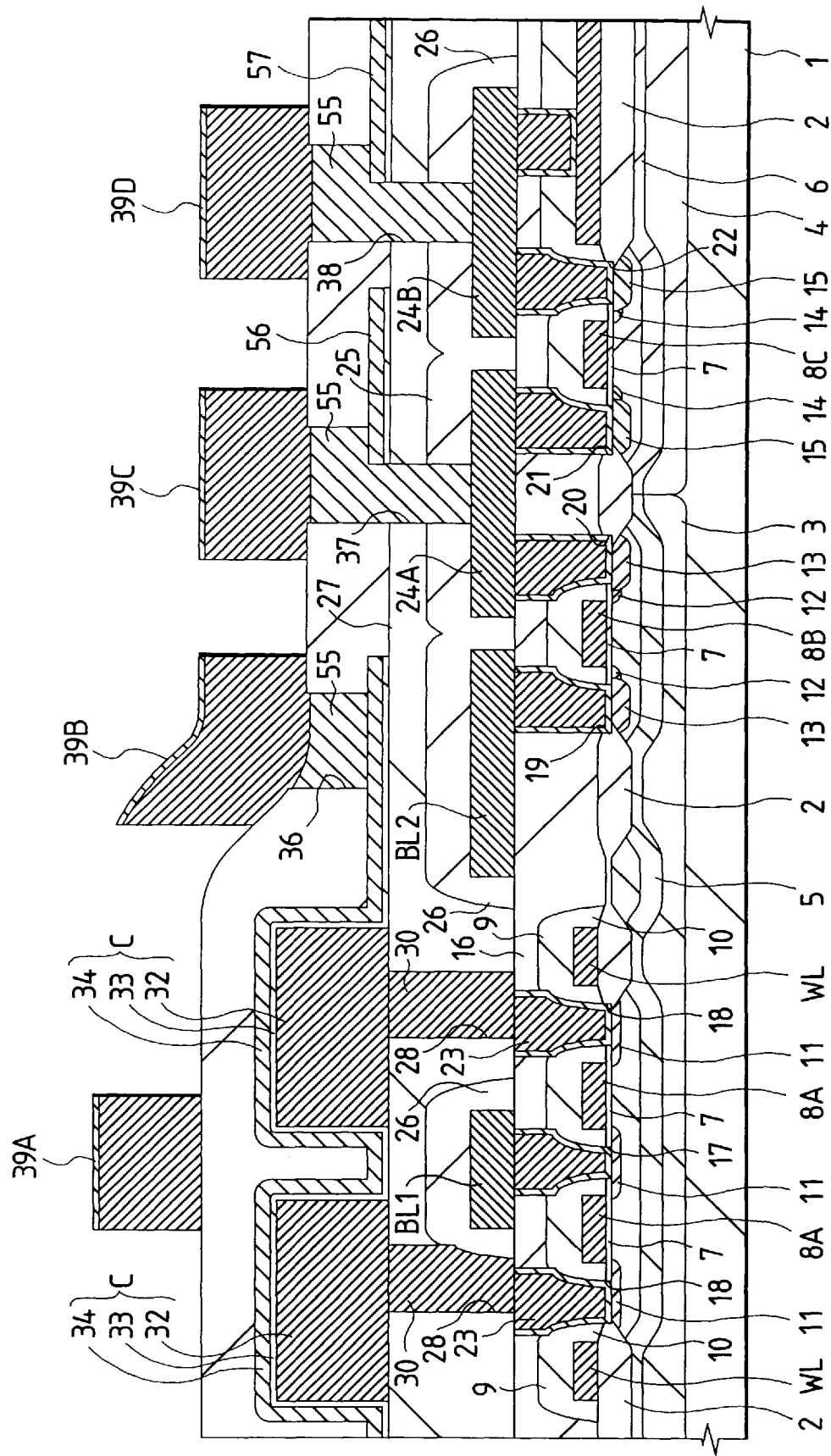

Next, as shown in FIG. 37, the TiN plugs 55 are buried in the contact holes 36, 37 and 38, and the wiring lines 39A, 39B, 39C and 39D are then formed over the silicon oxide film 35. As a result, the wiring line 56 is connected through the wiring line 39C with the underlying wiring line 24A, and the wiring line 57 is connected through the wiring line 39D with the underlying wiring line 24B.

By the DRAM manufacturing process of the present embodiment, by using a common material for the plate electrode (TiN) of the information storing capacitive element C and the wiring of the peripheral circuit, the wiring layers of the peripheral circuit can be increased to improve the degree of freedom of the wiring design.

By the DRAM manufacturing process of the present embodiment, the wiring layers of the peripheral circuit can be increased without any increase in the number of steps of manufacturing the DRAM.

(Embodiment 6)

In the DRAM manufacturing process of Embodiment 5, the contact hole 37 is formed over the wiring line 24A by etching the silicon oxide film 35, the silicon oxide film 27 and the silicon nitride film 25 in the regions having the wiring lines 56 and 57 of the peripheral circuit, and the contact hole 38 is formed over the wiring line 24B, so that one end of the wiring line 56 is exposed to the inside of the contact hole 37 whereas one end of the wiring line 57 is exposed to the inside of the contact hole 38 (as shown in FIG. 36). If, at this time, the etching selection rate of the wiring material (TiN) to the insulating films (the silicon oxide film and the silicon nitride film) is small, the plate electrode 34 and the wiring lines 56 and 57 may be etched to reduce the film thickness. In the present embodiment, therefore, the wiring lines 56 and 57 and the underlying wiring lines are connected by the following method.

Figure 38:
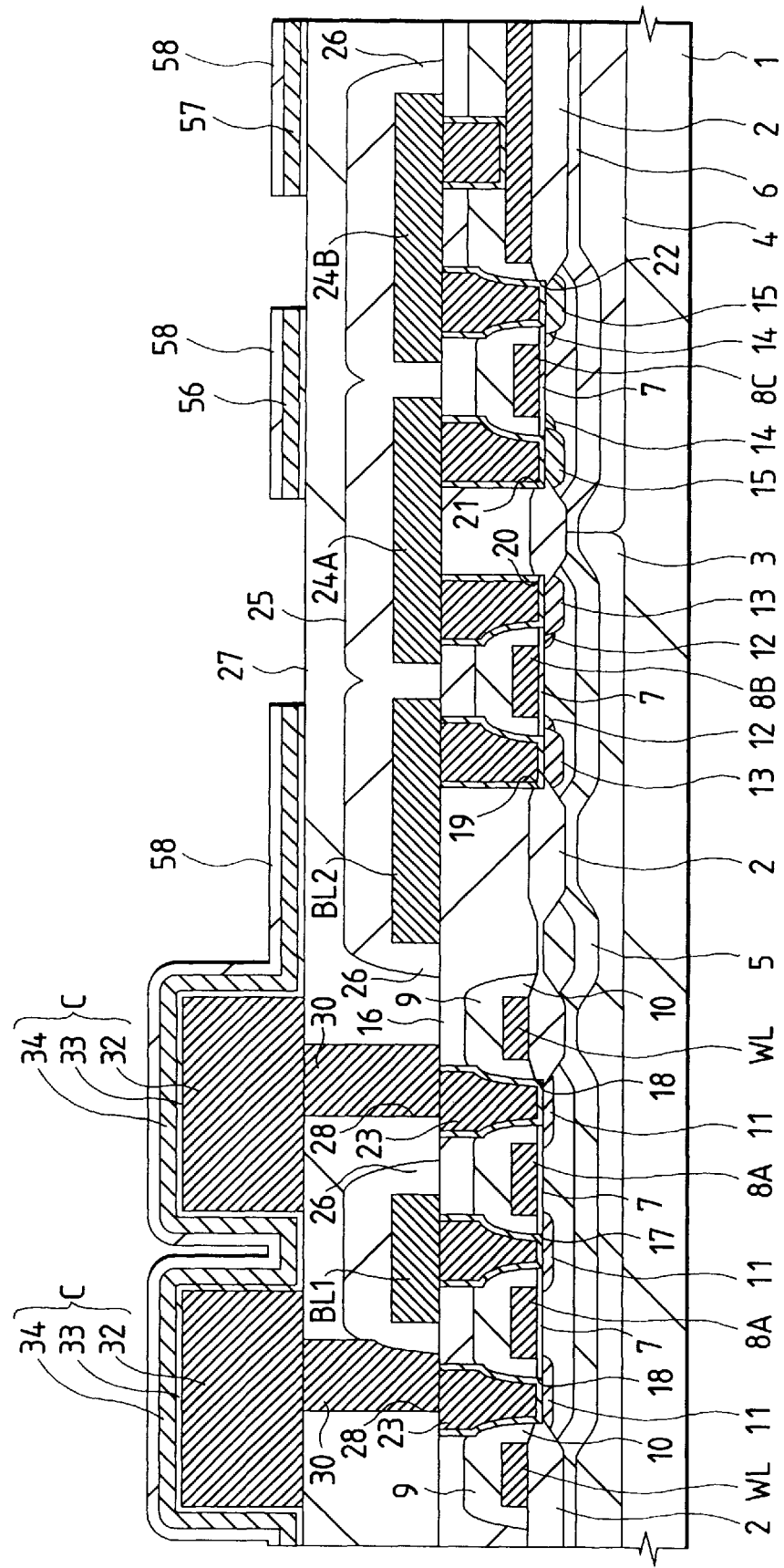
FIGS. 38 to 47 are section views of an essential portion of a semiconductor substrate and show respective steps of a process for manufacturing a semiconductor integrated circuit device representing an Embodiment 6 of the present invention.

First of all, as shown in FIG. 38, the capacitor insulating film 33 and the plate electrode 34 of the information storing capacitive element C are formed simultaneously with the wiring lines 56 and 57 of the peripheral circuit by patterning the $Ta_2O_5$ film, the TiN film and a third film (a high selection ratio film 58), deposited over the storage electrodes 32. The high selection ratio film 58 may be either an insulating film or a conductive film if it is made of a material having a high etching selection ratio with respect to the silicon oxide film or the silicon nitride film. A suitable film may be a tungsten (W) film.

Figure 39:
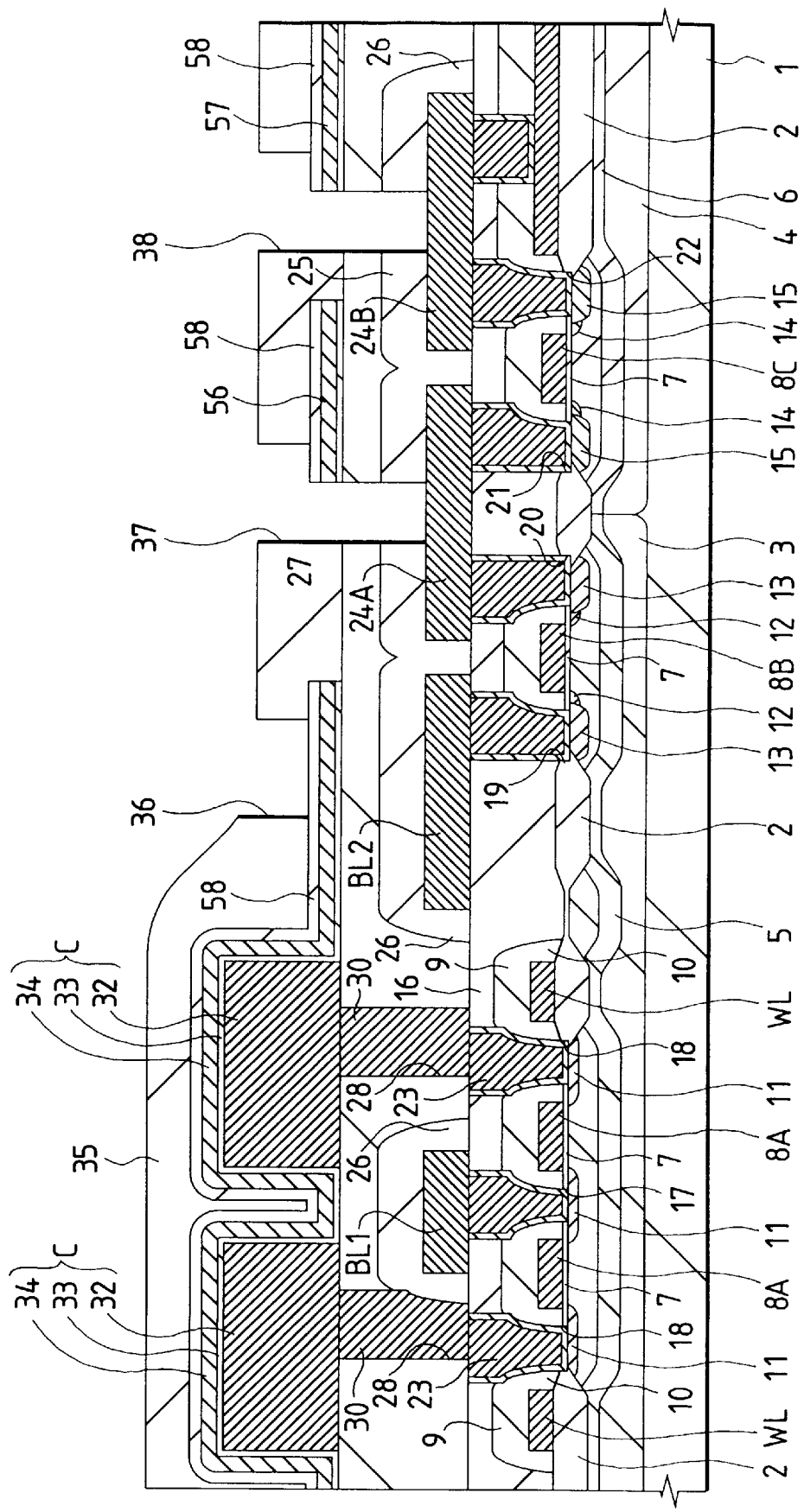

Next, as shown in FIG. 39, the contact holes 36 are formed over the plate electrode 34 of the information storing capacitive element C by etching the silicon oxide film 35, deposited over the information storing capacitive element C and the wiring lines 56 and 57, by using a photoresist as a mask. Simultaneously with this, the contact hole 37 is formed over the wiring line 24A of the peripheral circuit, and the contact hole 38 is formed over the wiring line 24B, by etching the silicon oxide film 35, the silicon oxide film 27 and the silicon nitride film 25 in the regions having the wiring lines 56 and 57. Since, at this time, the plate electrode 34 and the wiring lines 56 and 57 are covered with the high selection ratio film 58, the etching of the plate electrode 34 and the wiring lines 56 and 57 does not increase the film thickness.

Figure 40:
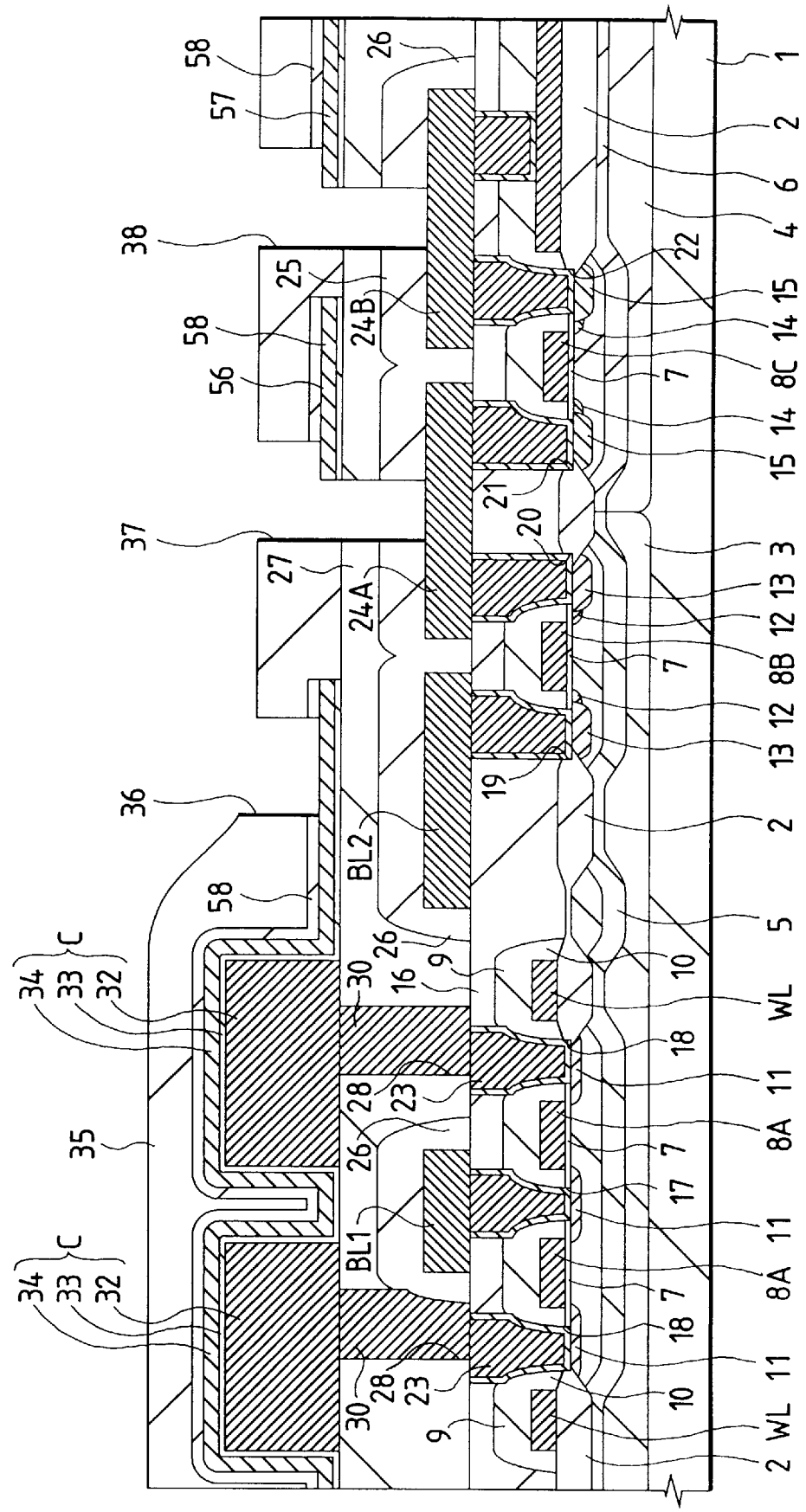

Next, as shown in FIG. 40, one end of the wiring line 56 is exposed to the inside of the contact hole 37, and one end of the wiring line is exposed to the inside of the contact hole 38 by etching the high selection ratio film 58 covering the plate electrode 34 and the wiring lines 56 and 57, at the final stage of the etching treatment. After this, the wiring lines 39A, 39B, 39C and 39D are formed over the silicon oxide film 35 in accordance with the process of Embodiment 5. Incidentally, this etching step is unnecessary if the high selection ratio film is made of tungsten.

By the DRAM manufacturing process of the present embodiment, it is possible to reliably prevent the drawback that the plate electrode 34 and the wiring lines 56 and 57 are etched and thinned at the step of forming the contact holes (36, 37 and 38).

The connection between the wiring lines 56 and 57 of the peripheral circuit and the underlying wiring lines may also be effected by the following method.

Figure 41:
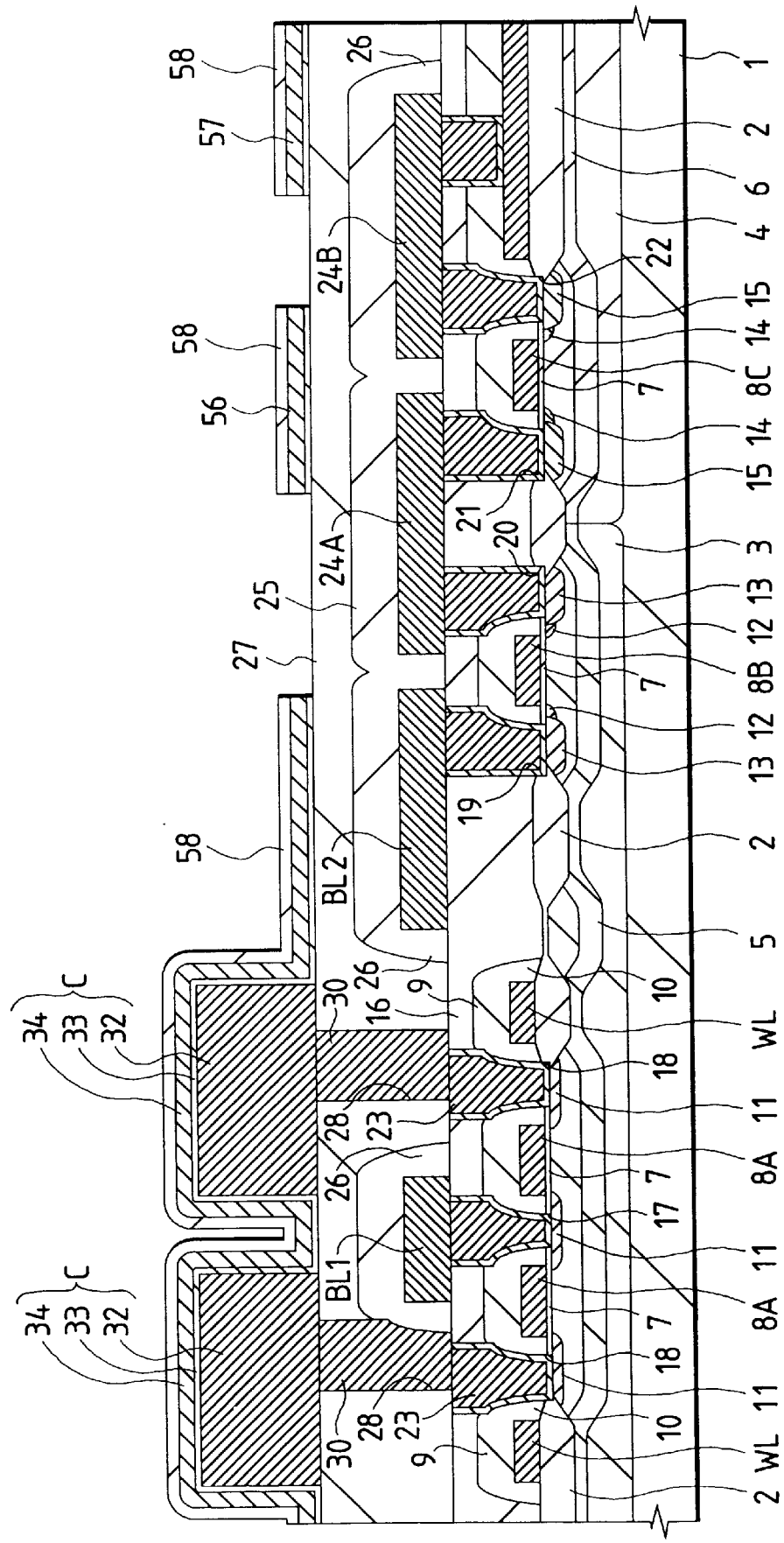

First of all, as shown in FIG. 41, the capacitor insulating film 33 and the plate electrode 34 are formed simultaneously with the wiring lines 56 and 57 of the peripheral circuit by patterning the $Ta_2O_5$ film, the TiN film and the high selection ratio film 58, deposited over the storage electrodes 32.

Figure 42:
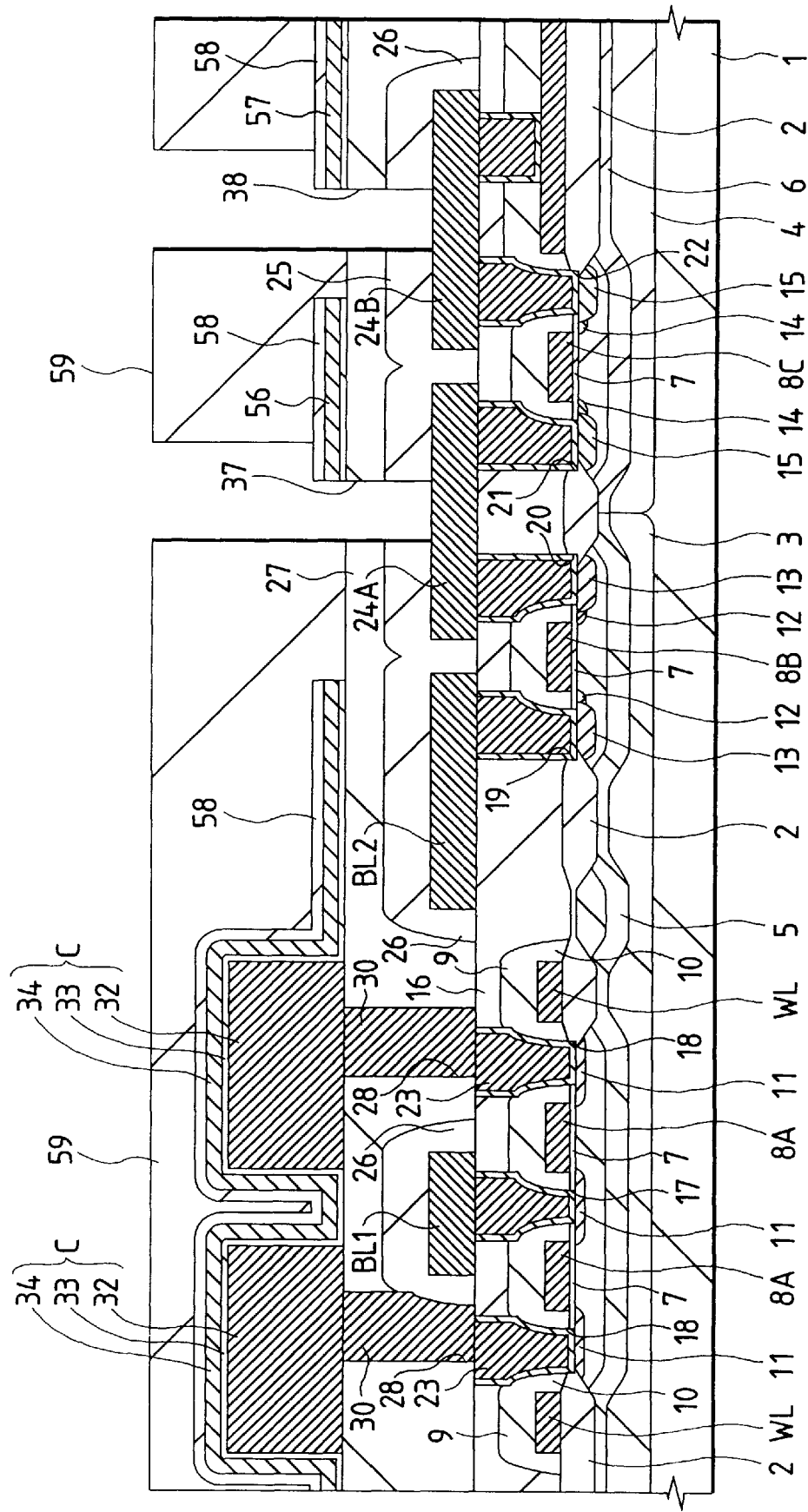

Next, as shown in FIG. 42, the contact hole 37 is formed over the wiring line 24A of the peripheral circuit, and the contact hole 38 is formed over the wiring line 24B, by etching the silicon oxide film 35, the silicon oxide film 27 and the silicon nitride film 25, formed over the wiring lines 56 and 57, by using a photoresist 59 as a mask. At this time, the high selection ratio film 58 covering the wiring lines 56 and 57 acts as an etching stopper to prevent the wiring lines 56 and 57 from being etched and thinned.

Figure 43:
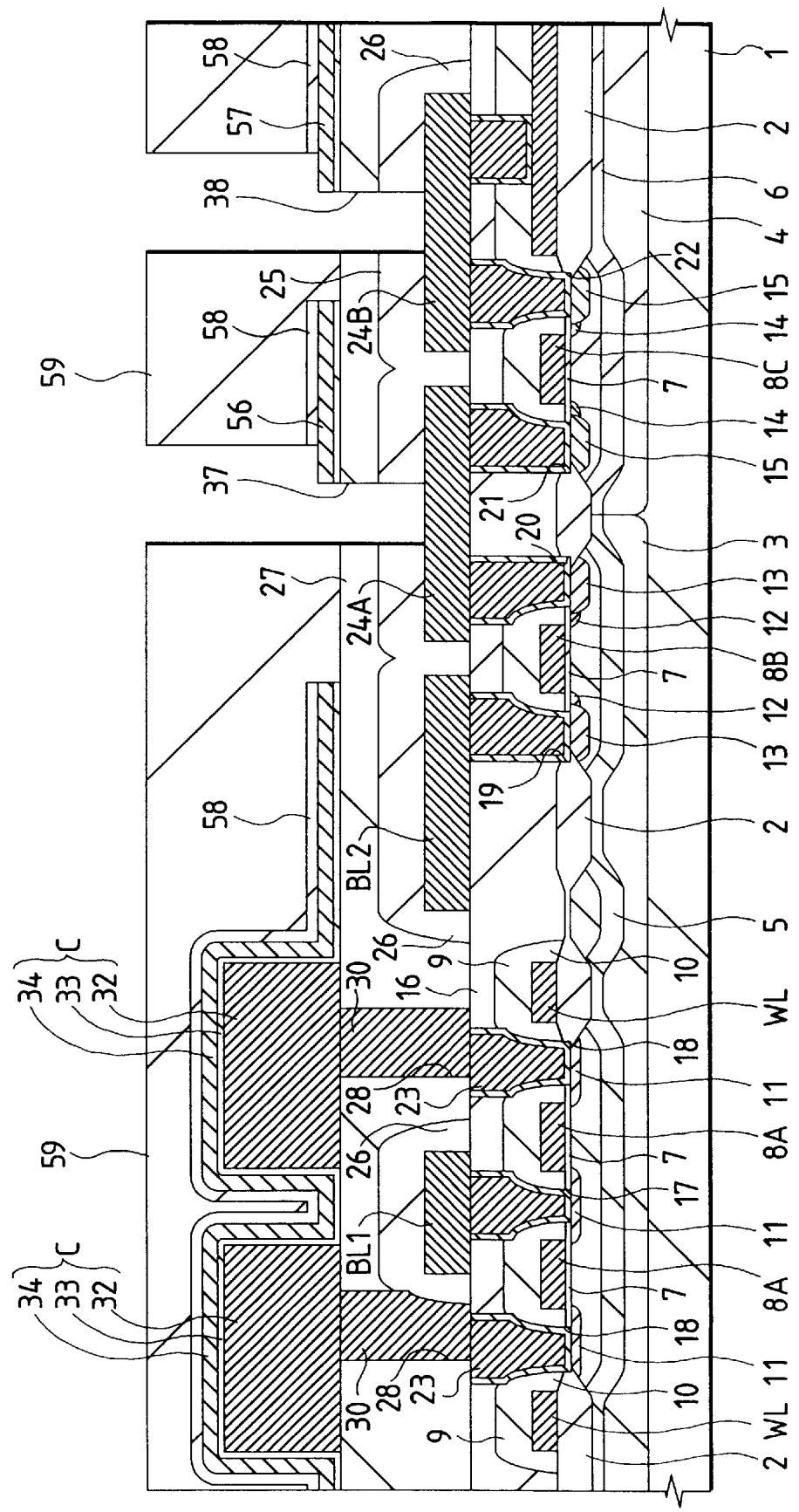

Next, as shown in FIG. 43, one end of the wiring line 56 is exposed inside the contact hole 37, and one end of the wiring line 57 is exposed inside the contact hole 38, by etching the high selection ratio film 58 covering the wiring lines 56 and 57, at the final etching stage.

Figure 44:
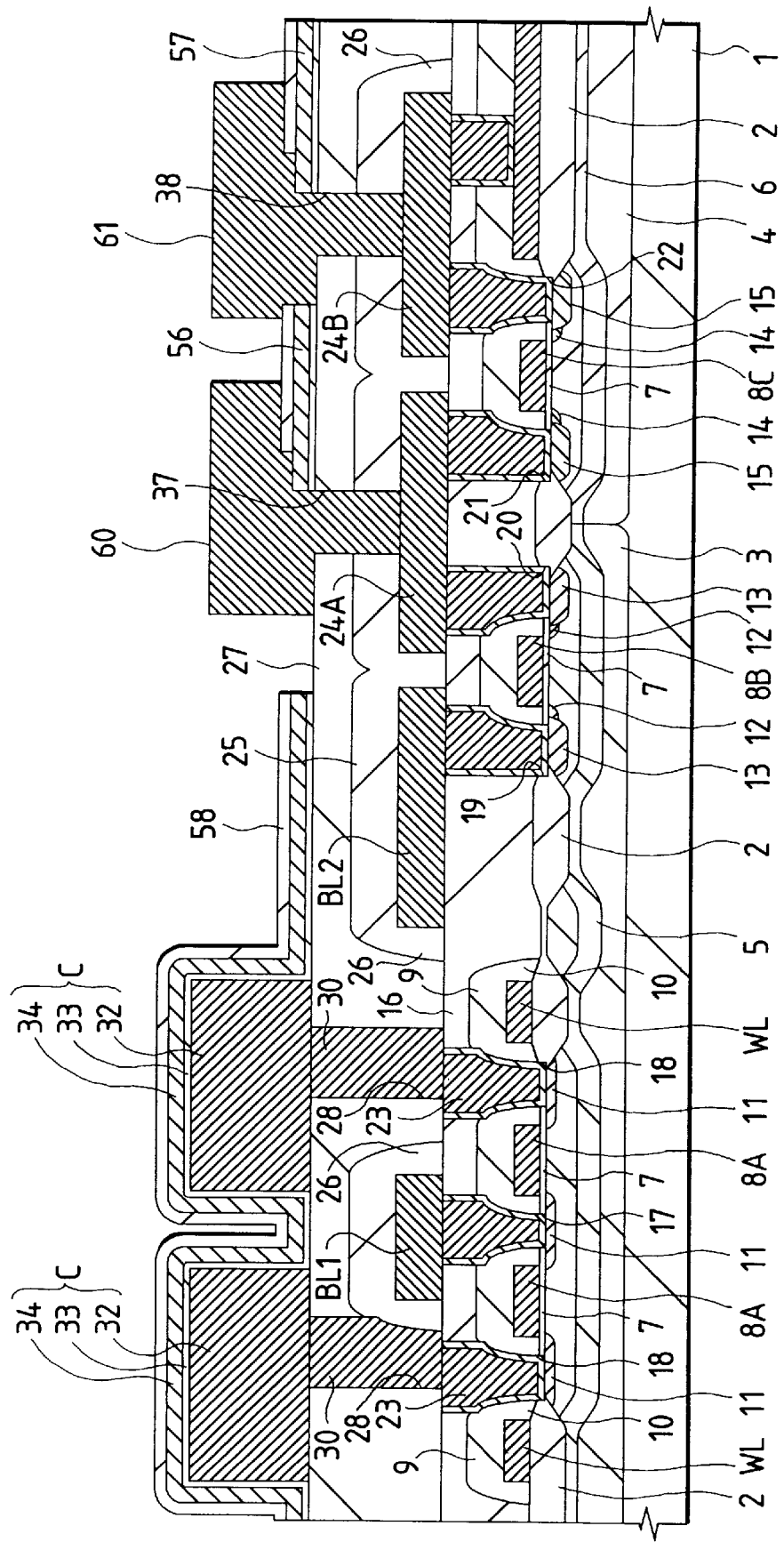

After this, as shown in FIG. 44, a wiring line 60 is formed over the contact hole 37, and a wiring line 61 is formed over the contact hole 38, by patterning the conductive film, deposited over the silicon oxide film 27. As a result, the wiring line 56 of the peripheral circuit is connected through the wiring line 60 to the underlying wiring line 24A, and the wiring line 57 is connected through the wiring line 61 to the underlying wiring line 24B.

The wiring lines 56 and 57 of the peripheral circuit and the underlying wiring lines may be connected by the following method.

Figure 45:
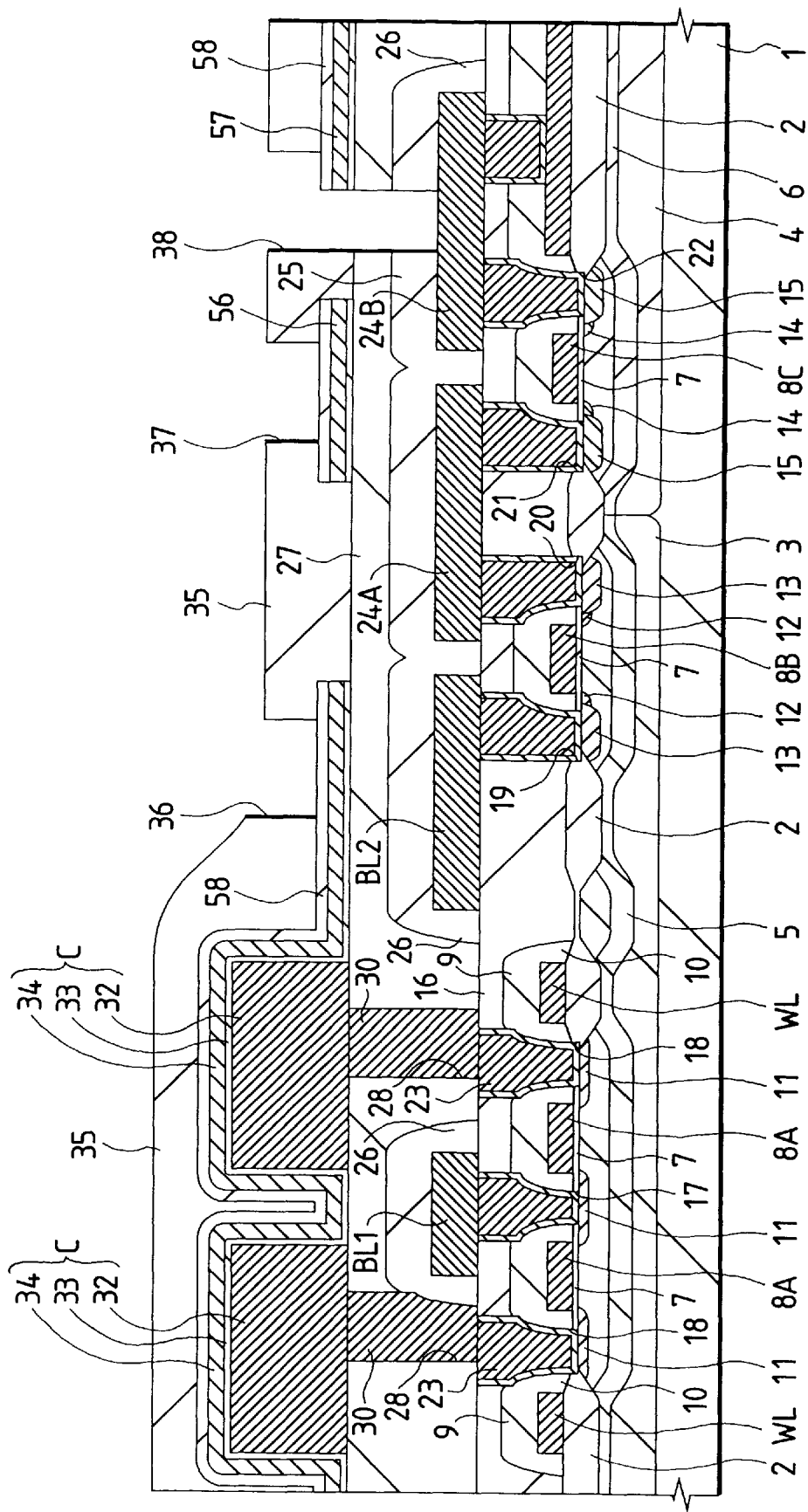

First of all, as shown in FIG. 45, the capacitor insulating film 33 and the plate electrode 34 of the information storing capacitive element C are formed together with the wiring lines 56 and 67 of the peripheral circuit, by patterning the Ta$_2$O$_5$ film, the TiN film and the high selection ratio film 58, deposited over the storage electrodes 32. After this, the contact hole 36 is formed over the plate electrode 34 of the information storing capacitive element C, and the contact hole 37 is formed over the wiring line 56, by etching the silicon oxide film 35, deposited over the information storing capacitive element C and the wiring lines 56 and 57, by using a photoresist as a mask. Simultaneously with this, the contact hole 38 is formed over the wiring line 24B of the peripheral circuit by etching the silicon oxide film 35, the silicon oxide film 27 and the silicon nitride film 25 in the region where the wiring line 57 is formed. At this time, the plate electrode 34 and the wiring lines 56 and 57 are covered with the high selection ratio film 58, so that they are prevented from being etched and thinned.

Figure 46:
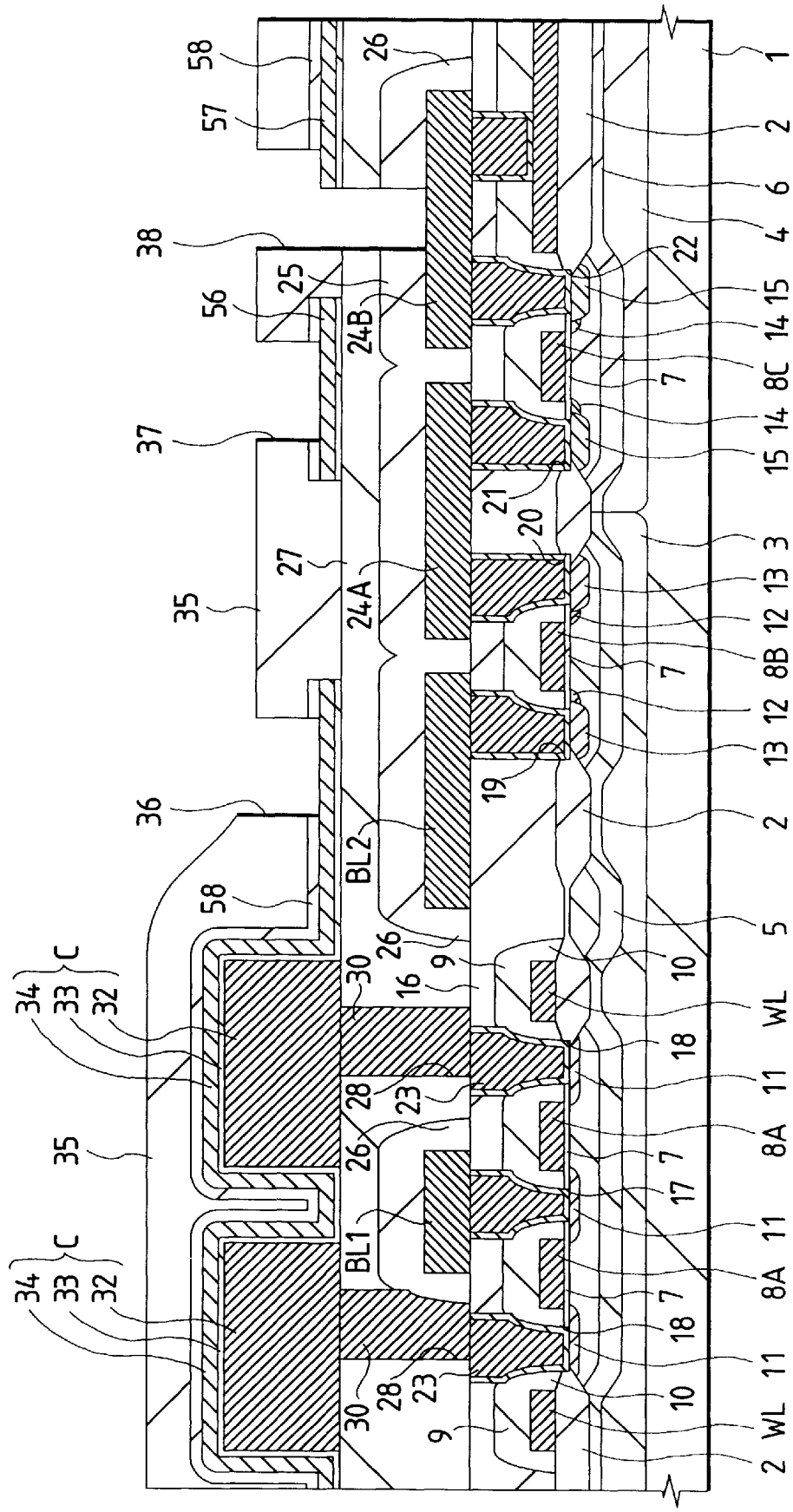

Next, as shown in FIG. 46, one end of the wiring line 56 is exposed inside of the contact hole 37, and one end of the wiring line 57 is exposed inside the contact hole 38, by etching the high selection ratio film 58 covering the wiring lines 56 and 57, at the final etching state.

Figure 47:
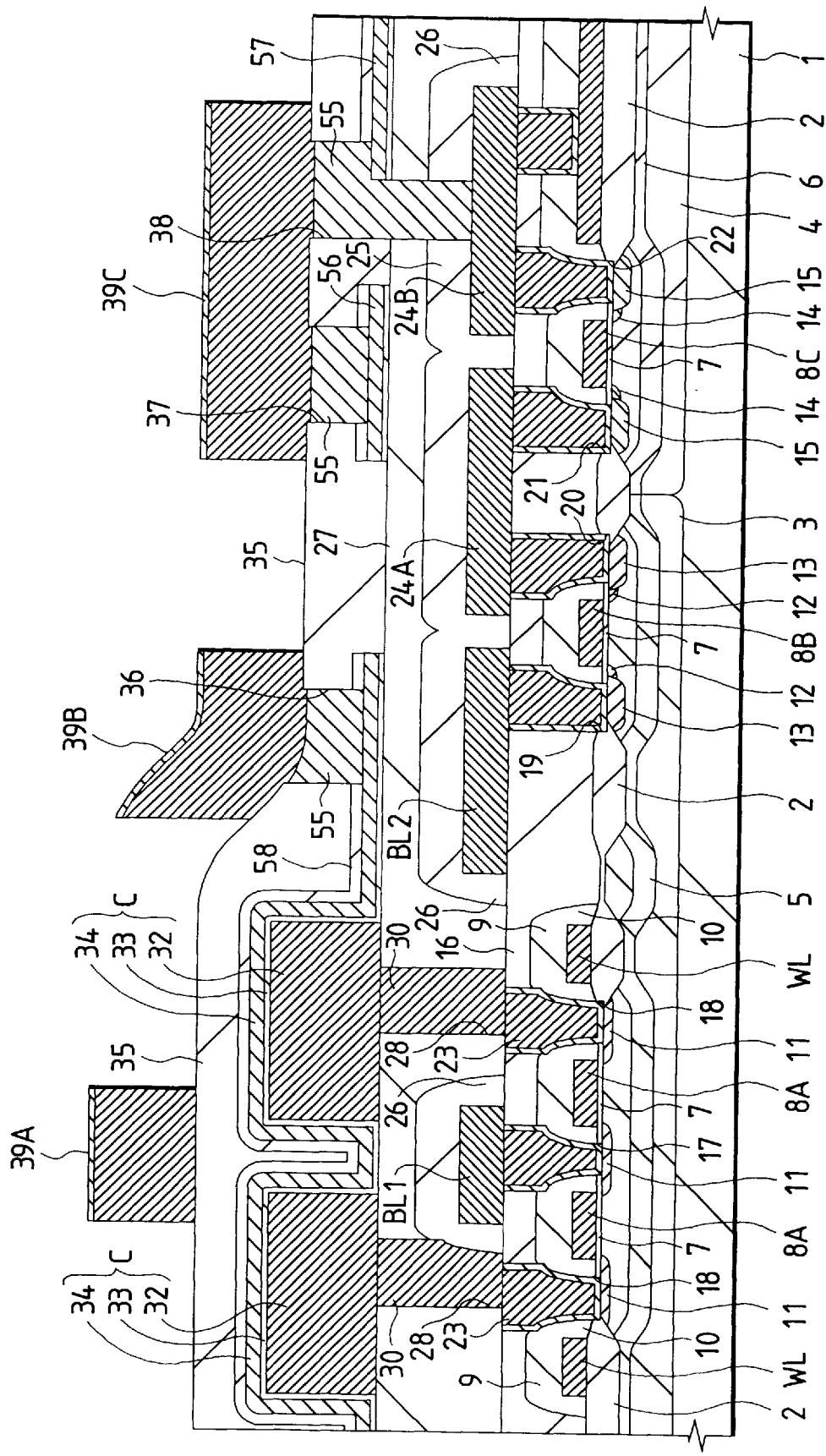

Next, as shown in FIG. 47, the TiN plugs 55 are buried in the contact holes 35, 36 and 37, and the wiring lines 39A, 39B and 39C are then formed over the silicon oxide film 35. As a result, the wiring line 56 of the peripheral circuit is connected through the wiring line 39C and the wiring line 57 with the underlying wiring line 24B.

(Embodiment 7)

The present embodiment is applied to a process for manufacturing a CMOS (Complementary Metal Oxide Semiconductor) FET.

Figure 48:
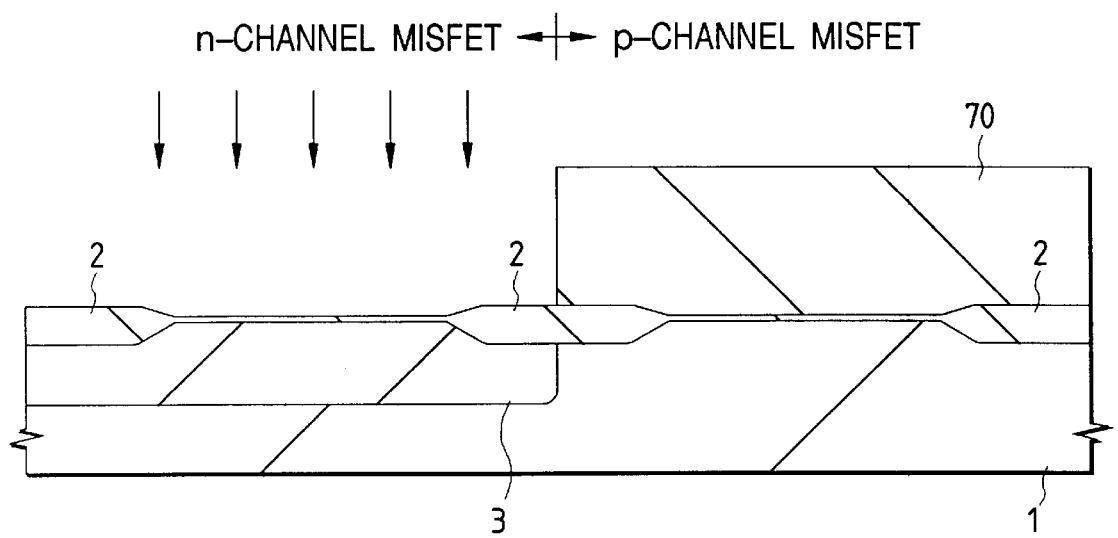
FIGS. 48 to 52 are section views of an essential portion of a semiconductor substrate and show respective steps of a process for manufacturing a semiconductor integrated circuit device representing an Embodiment 7 of the present invention.
Figure 49:
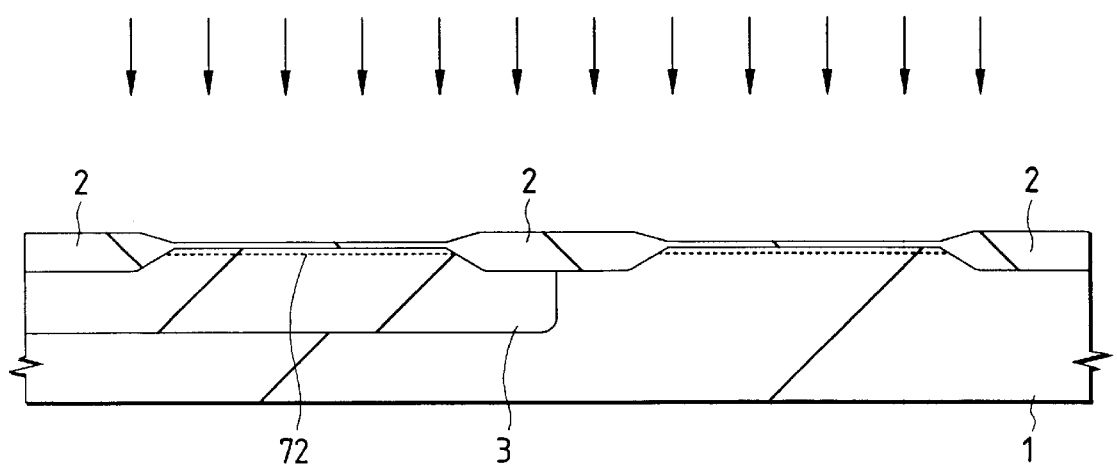

First of all, as shown in FIG. 48, the field oxide film 2 having a thickness of about 400 nm is formed over the surface of the semiconductor substrate 1. The field oxide film 2 is prepared by annealing the semiconductor substrate 1 at a temperature of about 1,000° C. by using a silicon nitride film as the mask.

Subsequently, the surface of the semiconductor substrate in the region to form the p-channel MISFET is covered with a photoresist 70, and the semiconductor substrate 1 in the region where the n-channel MISFET is formed is doped with ions of a p-type impurity (B) to form the p-type well 3.

Next, the photoresist 70 is removed, and the semiconductor substrate is annealed to repair the crystal defects which are caused by ion implantation of p-type impurity and is doped all over its surface with ions of a p-type impurity (B) to form a channel region 72 of the n-channel MISFET. At this time, the semiconductor substrate 1 in the region where the p-channel MISFET is formed is also doped with the ions of p-type impurity.

Figure 50:
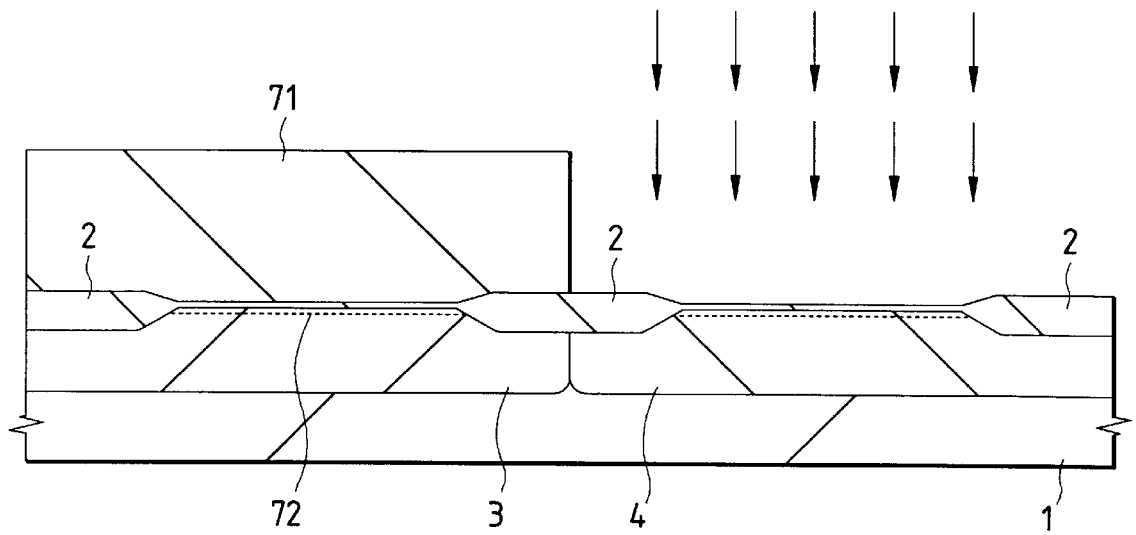

Next, as shown in FIG. 50, the region where the n-channel MISFET is formed, namely, the p-type well 3 is covered with a photoresist 71, and the semiconductor substrate 1 in the region where the p-channel MISFET is formed is doped twice with the n-type impurity (P) to form the n-type well 4. One of these two ion implantations is to improve the device characteristics and accordingly to introduce the impurity with a relatively low energy. The other ion implantation is to isolate the elements and to reduce the well resistance and accordingly to introduce the impurity with a relatively high energy. The lower-energy ion implantation is a pocket implantation of the PMOS to prevent the short channel effect of the PMOS. On the other hand, the higher-energy ion implantation has a peak impurity concentration at the interface between the field oxide film 2 and the semiconductor substrate 1.

Figure 51:
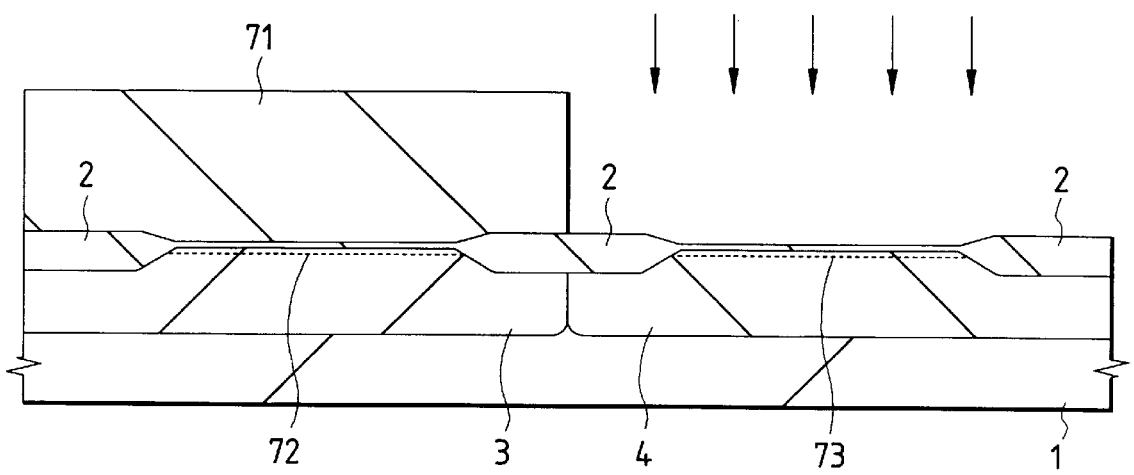

Next, as shown in FIG. 51, the n-type well 4 is doped with ions of an n-type impurity (P) to form a channel region 73 of the p-channel MISFET and to compensate the p-type impurity, the ions of which have been introduced at the step of forming the channel region of the aforementioned n-channel MISFET.

Incidentally, in the process described above, after the p-type well 3 has been formed, the photoresist 70 is removed, and the semiconductor substrate is then annealed to repair the crystal defects which has been caused by the ion implantation of the p-type impurity. Despite this description, however, the p-type well 3 may be doped with ions of p-type impurity while omitting the annealing step to leave the photoresist 70, thereby to form the channel region 72 of the n-channel MISFET.

Moreover, a process, in which the insulating film is buried in the shallow groove of Embodiment 3, can be applied to the element isolating region.

Figure 52:
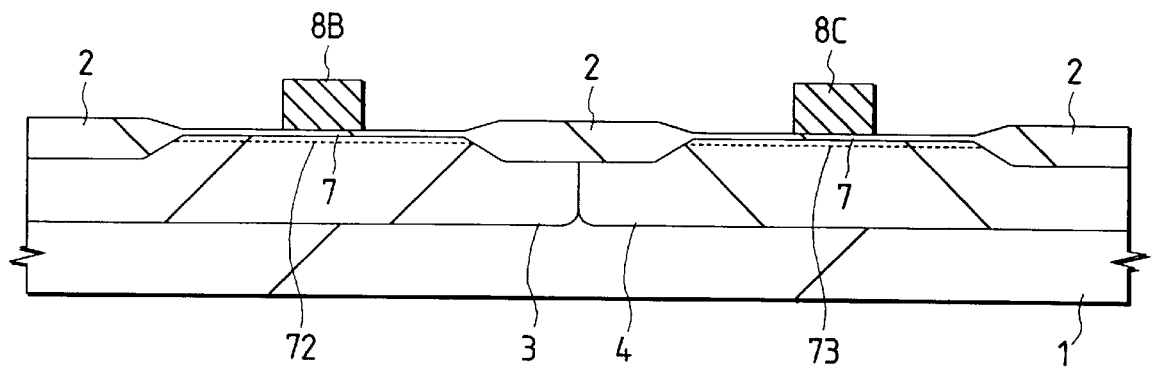

Next, after the photoresist 71 has been removed, the gate oxide film 7 is formed by a thermal oxidizing method over the surfaces of the individual active regions of the p-type well 3 and the n-type well 4, as shown in FIG. 52. Next, the gate electrode 8B of the n-channel MISFET and the gate electrode 8C of the p-channel MISFET are formed over the gate oxide film 7.

Figure 53:
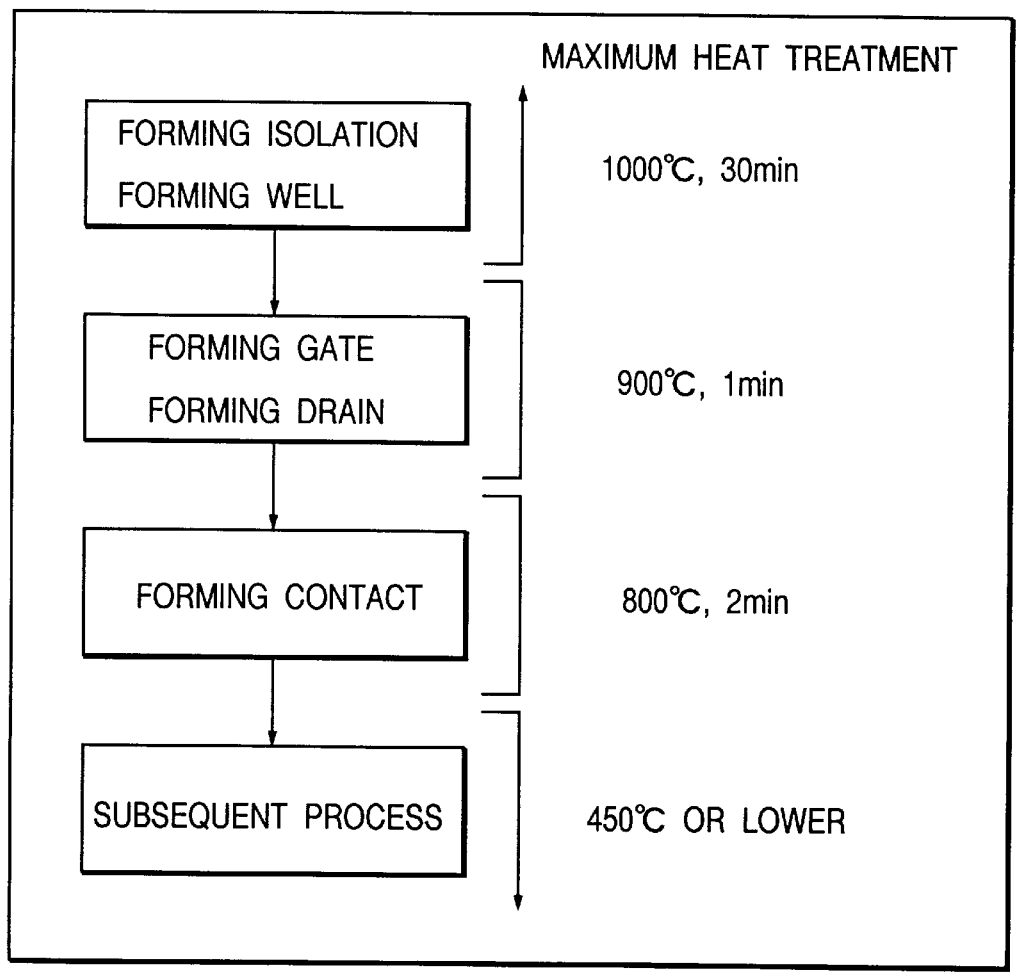
FIGS. 53 and 54 are flow charts of the semiconductor integrated circuit device manufacturing process of Embodiment 7 representing an the present invention.

The subsequent stops follow the flowchart shown in FIG. 53. Specifically, the impurity activation for forming the source region and the drain region is executed at a temperature of about 900° C. Moreover, the treatment for producing Ti silicide or the like on the bottom of the contact hole so as to lower the contact resistance between the first layer wiring line and the source region or the drain region is executed at 800° C., and the subsequent depositions of the wiring conductive film and the insulating film are executed at 450° C. or lower.

Figure 54:
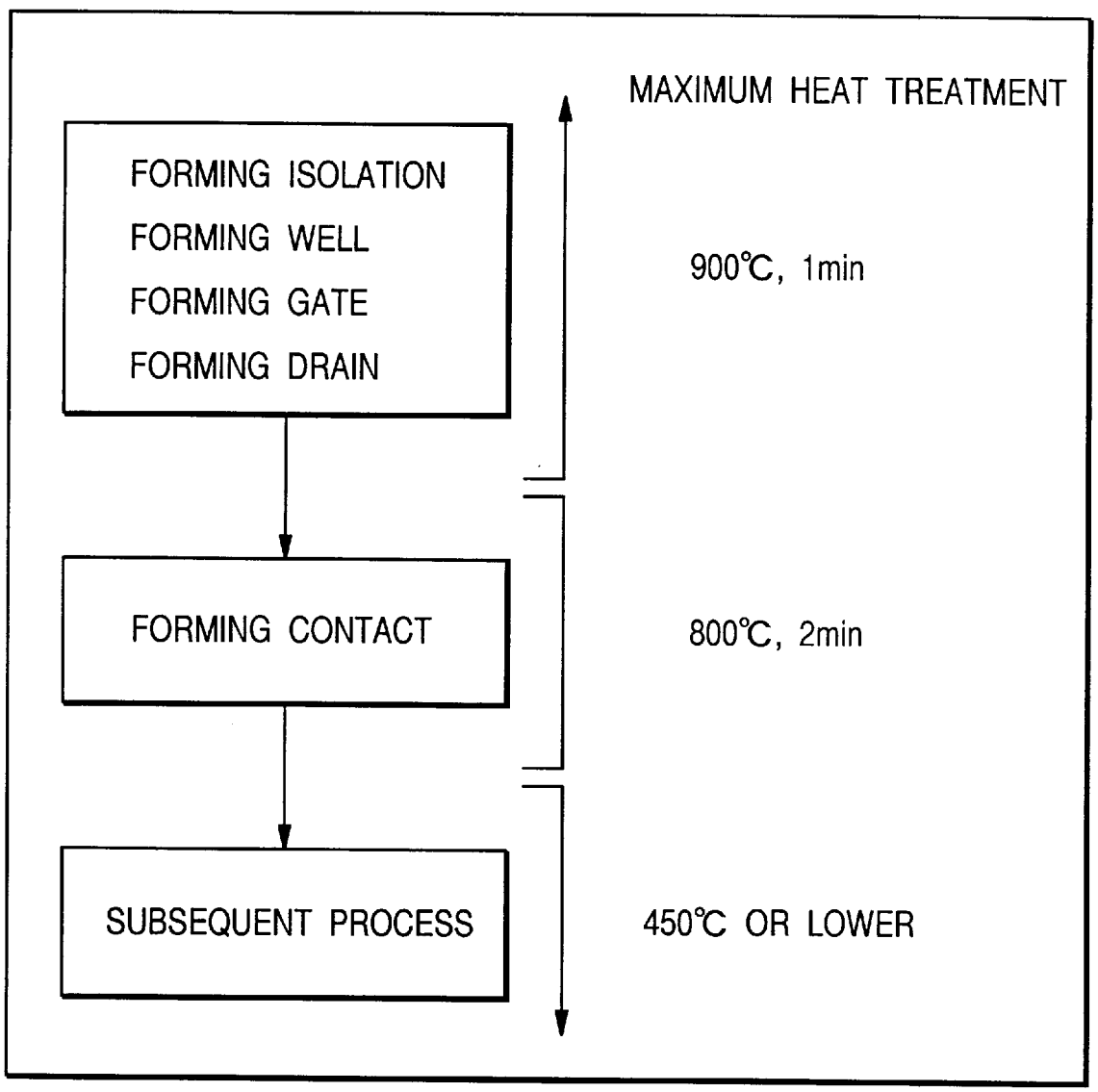

The element isolating with the shallow groove is executed according to the flowchart, shown in FIG. 54, as in Embodiment 3. Specifically, the impurity activation for forming the source region and the drain region is executed at a temperature of about 900° C. Moreover, the treatment for forming Ti silicide or the like on the bottom of the contact hole so as to lower the contact resistance between the first layer wiring line and the source region or the drain region is executed at 800° C., and the subsequent depositions of the wiring conductive film and the insulating film are executed at 450° C. or lower.

By the CMOSFET manufacturing process of the present embodiment, the formation of the p-type well and the channel region of the n-channel MISFET and the formation of the n-type well and the channel region of the p-channel MISFET can be made totally at two photoresist steps thereby to reduce the steps of manufacturing the CMOS LSI.

By the CMOSFET manufacturing process of the present embodiment, the upper limits of the temperatures for the heat treatments are made lower at the later steps so that the diffusion of the impurity into the substrate caused by the hot heat treatment can be suppressed to realize a shallower junction between the source region and the drain region thereby to promote the high performance of the CMOS LSI.

(Embodiment 8)

Figure 55:
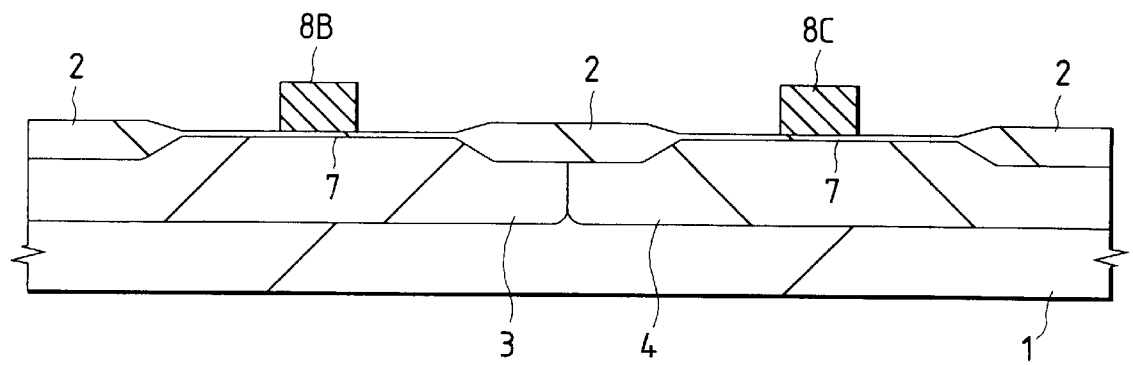
FIGS. 55 to 58 are section views of an essential portion of a semiconductor substrate and show respective steps of a process for manufacturing a semiconductor integrated circuit device representing an Embodiment 8 of the present invention.

In the CMOSFET manufacturing process of the present embodiment, as shown in FIG. 55, by the manufacturing process of Embodiment 7, the gate electrode 8B of the n-channel MISFET is formed at first over the gate oxide film 7 of the p-type well 3, and the gate electrode 8C of the p-channel MISFET is then formed over the gate oxide film 7 of the n-type well 4.

Figure 56:
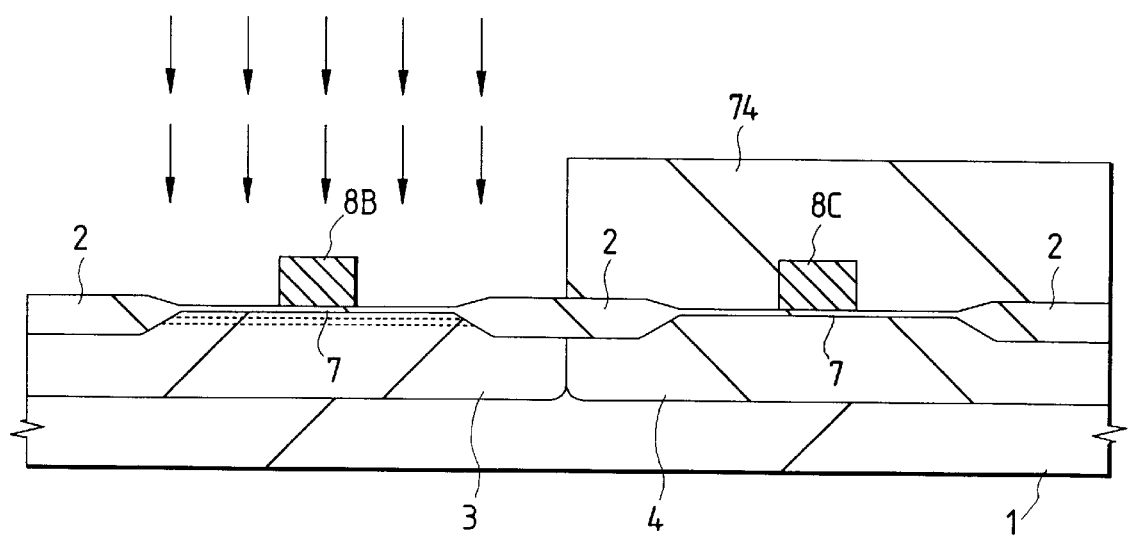

Next, as shown in FIG. 56, the surface of the n-type well 4 is covered with a photoresist 74, and the p-type well 3 is doped with ions of P and As. At this time, the ions of P are introduced more deeply and in a less dosage than the ions of As. Alternatively, the ions of P may be obliquely introduced.

Figure 57:
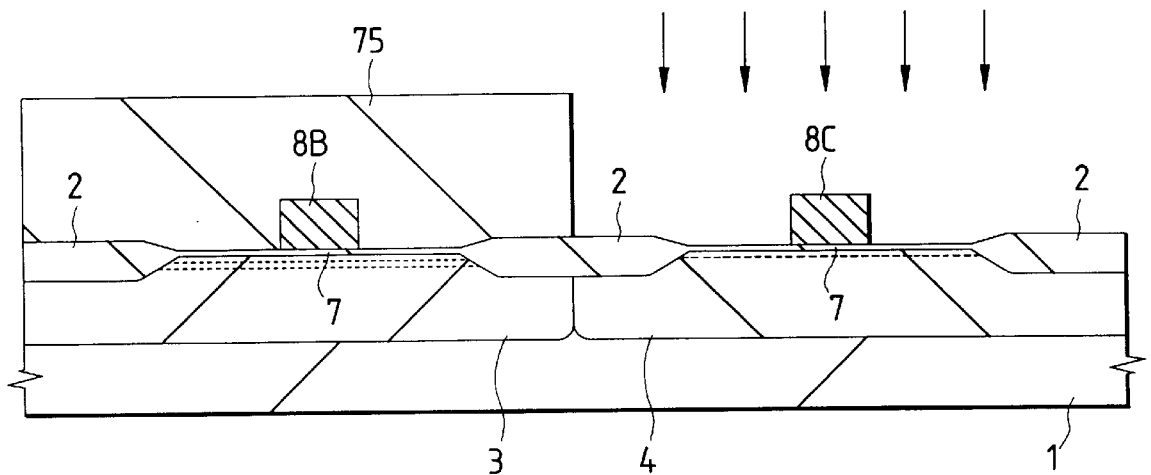

Next, after the photoresist 74 has been removed, as shown in FIG. 57, the surface of the p-type well 3 is covered with a photoresist 75, and the n-type well 4 is doped with ions of B.

Figure 58:
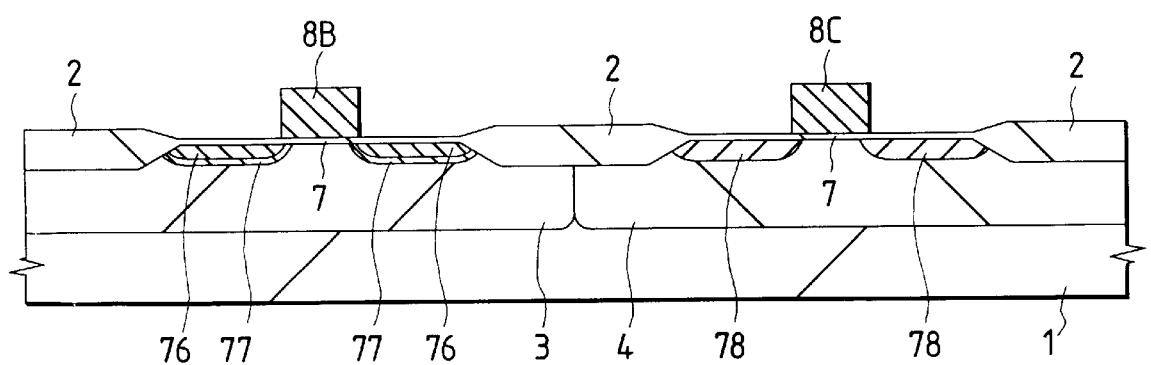

Next, after the photoresist 75 has been removed, as shown in FIG. 58, an annealing treatment for impurity activation is executed to form the source region and drain region of the n-channel MISFET and the source region and drain region of the p-channel MISFET. The source region and drain region of the n-channel MISFET is constructed of a double diffused drain structure, in which the periphery and bottom portion of an $n^+$-type semiconductor region 76, heavily doped with diffused As are surrounded by an $n^-$-type semiconductor region 77 lightly doped with diffused P, and the source region and drain region of the p-channel MISFET are constructed of a single diffused drain structure which has a p-type semiconductor region 78.

By the CMOSFET manufacturing process of the present embodiment, the source region and drain region of the n-channel MISFET, constructed of a double diffused drain, and the source region and drain region of the p-channel MISFET, constructed of a single diffused drain structure, can be formed totally by three ion implantations to simplify the CMOS LSI manufacturing process. Moreover, the source region and drain region of the n-channel MISFET is constructed of a double diffused drain structure so that the high electric field of the end portion of the drain region can be relaxed. As a result, it is possible to suppress the hot electron effect of the n-channel MISFET which raises a problem if the gate length is miniaturized.

Although our invention has been specifically described with reference to various Embodiments, the invention should not be limited thereto but can naturally be modified in various manners without departing from the gist thereof.

The effects to be obtained by representative aspects of the invention disclosed herein will be briefly described in the following.

By the manufacturing process of the present invention, at the step after the MISFET has been formed, all the conductive films are deposited at a temperature of 500° C. or lower over the semiconductor substrate so that the number of heat treatment steps can be reduced to form a MISFET of shallow junction.

By the manufacturing process of the present invention, at the step after the MISFET has been formed, all the insulating films are deposited at a temperature of 500° C. or lower over the semiconductor substrate so that the number of heat treatment steps can be reduced to form a MISFET of shallow junction.

By the manufacturing process of the present invention, all the conductive films are made of a metal or its compound so that the wiring resistance can be reduced.

By the manufacturing process of the present invention, it is possible to simplify the process for manufacturing the semiconductor integrated circuit device having MISFETs.

What is claimed is:

1. A process for manufacturing a semiconductor integrated circuit device, comprising:

(a) the step of forming a first semiconductor region in the major surface of a semiconductor substrate;

(b) the step of depositing a first insulating film over the of major surface of said semiconductor substrate;

(c) the step of forming a first opening in said first insulating film in such a way as to expose a portion of said first semiconductor region to the outside;

(d) the step of forming a first conductor layer made of a poly-silicon film selectively in said first opening;

(e) the step of forming a silicide film of a refractory metal layer selectively only over said first conductor layer by depositing said refractory metal film over said first conductor layer and said first insulating film and by subjecting the same to a heat treatment;

(f) the step of removing said refractory metal film from over first insulating film while leaving the silicide film of said refractory metal layer;

(g) the step of depositing a second insulating film over said first insulating film to form a second opening for exposing a portion of the silicide film of said refractory metal layer to the outside; and (h) the step of forming a second conductor layer in said second opening.

2. A semiconductor integrated circuit device manufacturing process according to claim 1, further comprising:

the step of forming an element isolating region having a fourth insulating film over the major surface of said semiconductor substrate;

the step of forming a third insulating film over the major surface of said semiconductor substrate; and the step of forming a third conductor layer over said third insulating film.

3. A semiconductor integrated circuit device manufacturing process according to claim 2, wherein the step of forming said element isolating region includes the step of forming a groove in the major surface of said semiconductor substrate, and the step of burying said fourth insulating film selectively in said groove.

4. A semiconductor integrated circuit device manufacturing process according to claim 2, further comprising:

the step of forming a fifth insulating film over and at the side wall of said third conductor layer, wherein said fifth insulating film is a silicon nitride film, and said first insulating film is a silicon oxide film.

* * * * *